United States Patent
Koyama

(10) Patent No.: US 9,184,210 B2
(45) Date of Patent: Nov. 10, 2015

(54) LIGHT EMITTING DEVICE WITH SELECTION CIRCUIT FOR IMAGE SIGNAL POLARITY INVERSION

(71) Applicant: Semiconductor Energy Laboratory Co., Ltd., Atsugi-shi, Kanagawa-ken (JP)

(72) Inventor: Jun Koyama, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 232 days.

(21) Appl. No.: 13/900,882

(22) Filed: May 23, 2013

(65) Prior Publication Data

US 2013/0321371 A1 Dec. 5, 2013

(30) Foreign Application Priority Data

May 31, 2012 (JP) ................................. 2012-124026

(51) Int. Cl.
*H01L 27/15* (2006.01)
*G09G 3/20* (2006.01)
(Continued)

(52) U.S. Cl.
CPC *H01L 27/15* (2013.01); *G09G 3/20* (2013.01); *G09G 3/3233* (2013.01); *G09G 3/3688* (2013.01); *G09G 3/3614* (2013.01); *G09G 2310/0291* (2013.01)

(58) Field of Classification Search
CPC ..... G09G 3/20; G09G 3/3614; G09G 3/3233; G09G 3/3688; G09G 2310/0291
USPC .......................................................... 345/209
See application file for complete search history.

(56) References Cited

U.S. PATENT DOCUMENTS

| 5,261,156 A | 11/1993 | Mase et al. |
| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced At Room Temperature,", Appl. Phys. Lett. (Applied Physics Letters) , Sep. 27, 2004, vol. 85, No. 13, pp. 2541-2543.

(Continued)

*Primary Examiner* — Larry Sternbane
(74) *Attorney, Agent, or Firm* — Eric J. Robinson; Robinson Intellectual Property Law Office, P.C.

(57) ABSTRACT

A light-emitting device capable of displaying an image using image signals having different polarities is provided. The light-emitting device includes a first circuit holding a first image signal having a first polarity, a second circuit holding a second image signal having a second polarity different from the first polarity and converting the second polarity of the held second image signal into the first polarity, and a light-emitting element whose luminance is sequentially determined in response to the first image signal held in the first circuit and the second image signal whose polarity is converted into the first polarity in the second circuit.

21 Claims, 13 Drawing Sheets

(51) Int. Cl.
 *G09G 3/32* (2006.01)
 *G09G 3/36* (2006.01)

(56) References Cited

U.S. PATENT DOCUMENTS

| | | | |
|---|---|---|---|
| 6,014,193 A * | 1/2000 | Taira et al. | 349/73 |
| 6,294,274 B1 | 9/2001 | Kawazoe et al. | |
| 6,563,174 B2 | 5/2003 | Kawasaki et al. | |
| 6,628,253 B1 | 9/2003 | Hiroki | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,142,203 B2 | 11/2006 | Hiroki et al. | |
| 7,190,358 B2 | 3/2007 | Hiroki | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,948,452 B2 * | 5/2011 | Sato et al. | 345/76 |
| 8,009,159 B2 | 8/2011 | Hiroki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-014880 | 1/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-286119 | 11/2007 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID Digest of Technical Papers, May 20, 2008, vol. 39, pp. 621-624.

(56) References Cited

OTHER PUBLICATIONS

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID International Symposium Digest of Technical Papers, May 31, 2009, pp. 184-187.

Nomura. K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amoilphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society Of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Indium Oxide Thin Film Transistors for AMOLED Back-Plane,", SID Digest '09 : SID International Symposium Digest of Technical Papers, May 31, 2009, pp. 280-283.

Lee.M et al., "15.4 Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

(56) References Cited

OTHER PUBLICATIONS

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "SPINEL, YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B. (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

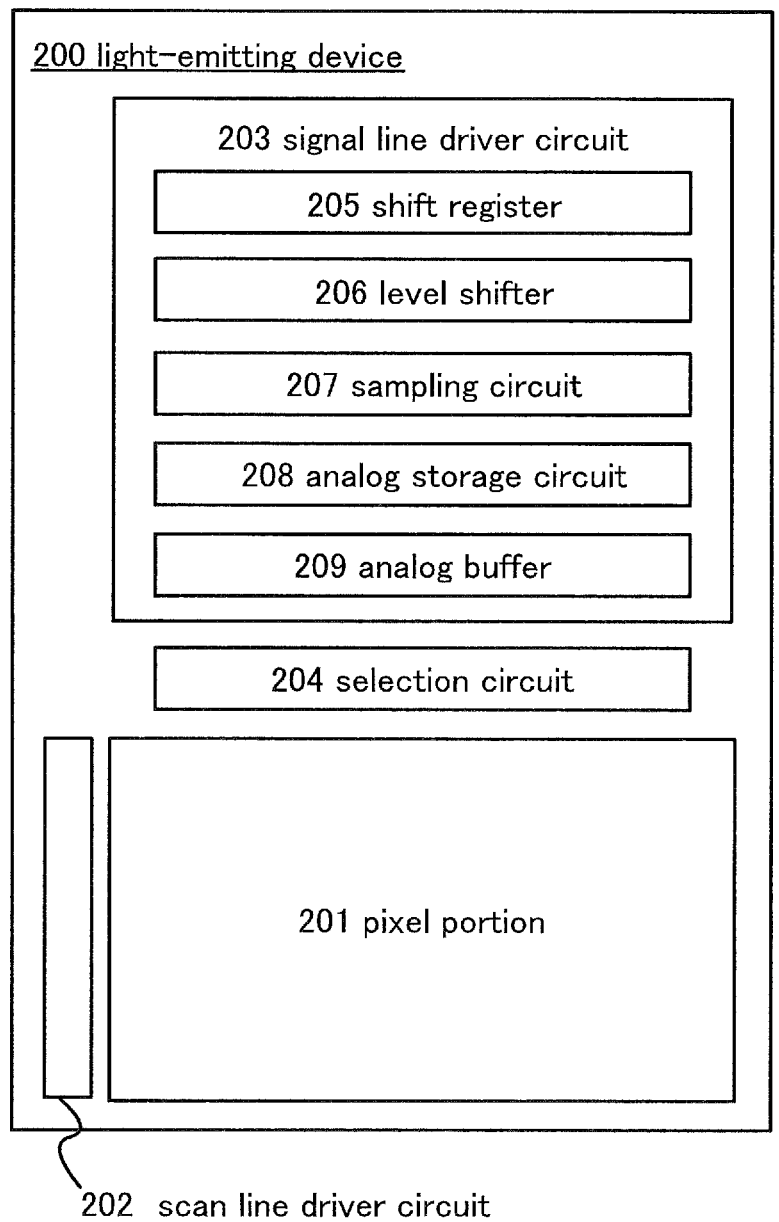

LIGHT EMITTING DEVICE WITH SELECTION CIRCUIT FOR IMAGE SIGNAL POLARITY INVERSION

BACKGROUND OF THE INVENTION

1. Field of the Invention

The present invention relates to a light-emitting device in which a light-emitting element is provided in each pixel.

2. Description of the Related Art

The number of pixels in a semiconductor display device such as a liquid crystal display device or a light-emitting device has been increased to display images with higher definition and higher resolution. Thus, a scan line driver circuit and a signal line driver circuit need to be driven at high speed. In particular, while pixels in lines are selected by the scan line driver circuit, the signal line driver circuit needs to input image signals to all the pixels in the lines. Thus, the drive frequency of the signal line driver circuit is much higher than that of the scan line driver circuit.

In order to achieve driving at high drive frequency, it is effective to use a transistor having high mobility and a channel formation region including crystalline silicon such as single crystal silicon in a signal line driver circuit. In a commercially available liquid crystal display device, a driver circuit manufactured using a single crystal silicon wafer or the like is mounted around a substrate provided with a pixel portion as an IC chip by tape automated bonding (TAB), chip on glass (COG), or the like.

Patent Document 1 discloses a technique by which a driver circuit formed using a silicon IC chip is mounted on a panel. Patent Document 2 discloses a technique by which a driver circuit formed over a glass substrate is divided into thin rectangular shapes and mounted on a substrate provided with a pixel portion.

REFERENCE

[Patent Document 1] Japanese Published Patent Application No. 2007-286119

[Patent Document 2] Japanese Published Patent Application No. 7-014880

SUMMARY OF THE INVENTION

Since light-emitting devices having light-emitting elements have high visibility, are suitable for reduction in thickness, and do not have limitations on viewing angle, they have attracted attention as semiconductor display devices which are alternatives to liquid crystal display devices. The light-emitting devices are putting into practical use; however, the market penetration rate of the light-emitting devices is much lower than that of liquid crystal display devices. Accordingly, the production volume of IC chips in driver circuits of the light-emitting devices is smaller than that of IC chips in driver circuits of the liquid crystal display devices. Consequently, the production cost of the IC chips of the light-emitting devices is high.

In a liquid crystal display device, driving in which the polarity of voltage to be applied to a liquid crystal element is inverted in predetermined timing, that is, AC driving is often employed to prevent degradation called burn-in of liquid crystals. Thus, a signal line driver circuit for the liquid crystal display device is designed to output an image signal having a positive polarity and an image signal having a negative polarity. A light-emitting element such as a light-emitting diode (LED) or an organic light-emitting diode (OLED) used in a light-emitting device emits light by supply of current in a forward direction. Thus, a signal line driver circuit for the light-emitting device is designed to output an image signal having a positive or negative polarity.

Thus, in the case where the signal line driver circuit for the liquid crystal display device is used as the signal line driver circuit for the light-emitting device, one of the image signal having a positive polarity and the image signal having a negative polarity that are output from the signal line driver circuit does not contribute to image display in the light-emitting device. Consequently, drive frequency needed for the signal line driver circuit for the liquid crystal display device is approximately twice that of the signal line driver circuit for the light-emitting device when the same frame frequency is used in the pixel portion, and a load on the signal line driver circuit becomes larger, which is a disadvantage.

In other words, the IC chip of the signal line driver circuit for the liquid crystal display device has an advantage of low production cost; however, it is unfavorable to use the IC chip of the signal line driver circuit for the liquid crystal display device in the light-emitting device because the disadvantage is caused.

With the technical background, an object of the present invention is to provide a light-emitting device capable of displaying an image using image signals having different polarities.

In one embodiment of the present invention, a light-emitting device includes a circuit holding an image signal having a positive polarity and an image signal having a negative polarity that are output from a signal line driver circuit, converting the polarity of one of the two held image signals into an opposite polarity, and making the two image signals have the same polarity.

In one embodiment of the present invention, using the circuit making the two image signals have the same polarity, the image signal having a positive polarity and the image signal having a negative polarity that are output from the signal line driver circuit can contribute to image display in the light-emitting device. In addition, in one embodiment of the present invention, by holding the image signal having a positive polarity and the image signal having a negative polarity and converting the polarity of one of the two held image signals into an opposite polarity, a delay-time difference between the two image signals output from the circuit can be reduced.

Specifically, a light-emitting device according to one embodiment of the present invention includes a driver circuit sequentially generating a first image signal having a first polarity and a second image signal having a second polarity different from the first polarity, a first circuit holding the first image signal, a second circuit holding the second image signal and converting the second polarity of the held second image signal into the first polarity, and a light-emitting element whose luminance is sequentially determined in response to the first image signal held in the first circuit and the second image signal whose polarity is converted into the first polarity in the second circuit.

In one embodiment of the present invention, it is possible to provide a light-emitting device capable of displaying an image using image signals having different polarities.

BRIEF DESCRIPTION OF THE DRAWINGS

In the accompanying drawings:

FIG. 7 illustrates a structure of a light-emitting device;

DETAILED DESCRIPTION OF THE INVENTION

Embodiments of the present invention will be described in detail below with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments.

Note that in this specification, the category of light-emitting devices includes panels in which a light-emitting element is formed in each pixel, and modules in which IC chips and the like including signal line driver circuits are mounted on the panels.

Embodiment 1

Figure 1:
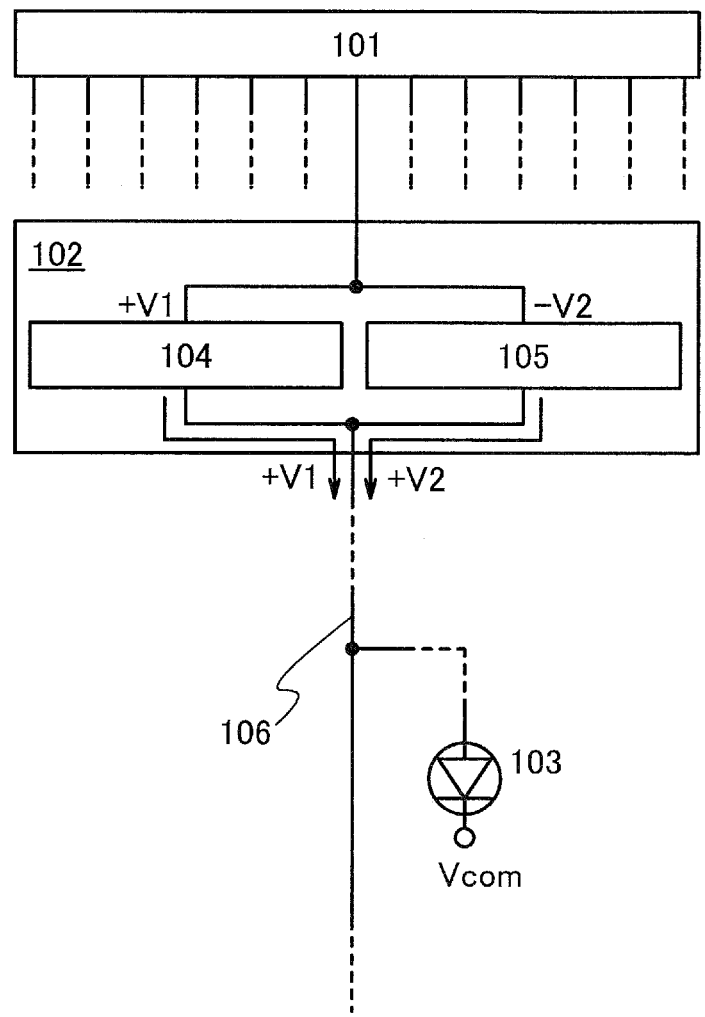
FIG. 1 illustrates a structure of a light-emitting device.

FIG. 1 illustrates a structure example of a light-emitting device 100 according to one embodiment of the present invention. The light-emitting device 100 in FIG. 1 includes a signal line driver circuit 101 generating a first image signal having a positive polarity and a second image signal having a negative polarity, a selection circuit 102 holding the first image signal having a positive polarity and the second image signal having a negative polarity and making the two image signals have the same polarity by converting the polarity of one of the two held image signals into an opposite polarity, and a light-emitting element 103 whose luminance is sequentially determined in response to the two image signals.

Specifically, the signal line driver circuit 101 has a function of converting an input serial image signal into a parallel image signal and outputting the parallel image signal. Further, among image signals output from the signal line driver circuit 101, one of a first image signal and a second image signal corresponding to one signal line has a positive polarity, and the other of the first image signal and the second image signal has a negative polarity.

Note that the potential of one of a cathode and an anode of the light-emitting element is controlled in response to an image signal, and a reference potential (referred to as a reference potential Vcom) such as a ground potential is applied to the other of the cathode and the anode of the light-emitting element. The first image signal and the second image signal have a positive polarity when they have a potential that is higher than the reference potential Vcom. The first image signal and the second image signal have a negative polarity when they have a potential that is lower than the reference potential Vcom. Note that depending on image information, the potential of the first image signal or the second image signal is equal to the reference potential Vcom and the first image signal or the second image signal does not have any polarity in some cases.

The signal line driver circuit 101 needs to operate at high speed. Thus, the signal line driver circuit 101 preferably includes a semiconductor element such as a diode or a transistor including polycrystalline or single crystal silicon or germanium.

The selection circuit 102 includes a first selection circuit 104 and a second selection circuit 105. The first selection circuit 104 has a function of holding one of the first image signal and the second image signal. The second selection circuit 105 has a function of holding the other of the first image signal and the second image signal. The second selection circuit 105 also has a function of converting the polarity of an image signal held in the second selection circuit 105 into a polarity that is the same as the polarity of an image signal held in the first selection circuit 104.

Specifically, in FIG. 1, the first image signal having a potential +V1 and a positive polarity is held in the first selection circuit 104 and the held potential +V1 is applied to a signal line 106. In addition, in FIG. 1, the second image signal having a potential −V2 and a negative polarity is held in the second selection circuit 105, and the held potential −V2 is converted into a potential +V2 and is applied to the signal line 106. Note that Vcom<+V1, and −V2<Vcom.

The selection circuit 102 is not necessarily directly connected to the signal line 106. A circuit changing the level of the potential of an image signal without changing image information contained in the image signal is provided between the selection circuit 102 and the signal line 106 in some cases. In such a case, the potential of an image signal output from the selection circuit 102 is not always equal to the potential of an image signal supplied to the signal line 106. In one embodiment of the present invention, the use of the selection circuit 102 at least makes the first image signal and the second image signal sequentially supplied to the signal line 106 have the same polarity.

In this specification, the term "connection" means electrical connection and corresponds to a state where current, voltage, or a potential can be supplied or transmitted. Accordingly, a connection state does not always mean a direct connection state but includes an indirect connection state through a circuit element such as a wiring, a resistor, a diode, or a transistor so that current, voltage, or a potential can be supplied or transmitted.

Examples of the light-emitting element 103 include an element whose luminance is controlled by current or voltage. For example, an OLED can be used as the light-emitting element 103. An OLED includes at least an EL layer, an anode, and a cathode. The EL layer is formed using a single layer or a plurality of layers provided between the anode and the cathode, at least one of which is a light-emitting layer containing a light-emitting substance. From the EL layer, electroluminescence is obtained by current supplied when a potential difference between the cathode and the anode is higher than or equal to the threshold voltage Vthe of the light-emitting element 103. Electroluminescence includes luminescence (fluorescence) at the time of returning from a singlet-excited state to a ground state and luminescence (phosphorescence) at the time of returning from a triplet-excited state to a ground state.

Note that in FIG. 1, the luminance of the light-emitting element 103 is determined sequentially in response to the first image signal and the second image signal each having a positive polarity. However, depending on which one of the anode and the cathode of the light-emitting element 103 is supplied with the reference potential Vcom, the luminance of the light-emitting element 103 might be determined sequentially in response to the first image signal and the second image signal each having a negative polarity.

Figure 2:
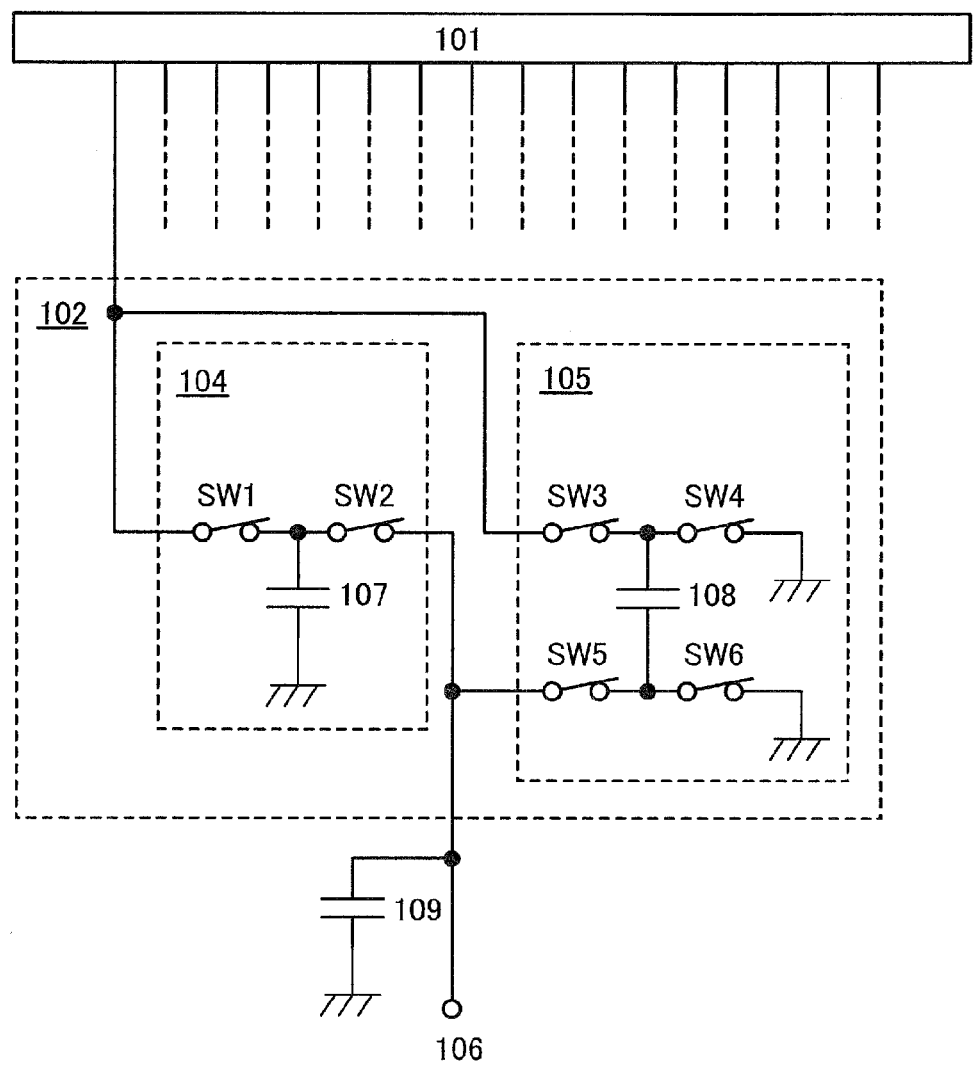
FIG. 2 illustrates a structure of a selection circuit.

Next, FIG. 2 illustrates a more detail structure example of the first selection circuit 104 and the second selection circuit 105 in the selection circuit 102.

FIG. 2 illustrates the signal line driver circuit 101 and the selection circuit 102. The first selection circuit 104 in FIG. 2 includes a switch SW1, a switch SW2, and a capacitor 107. The second selection circuit 105 in FIG. 2 includes a switch SW3, a switch SW4, a switch SW5, a switch SW6, and a capacitor 108.

In the first selection circuit 104, the switch SW1 has a function of controlling input of the first image signal generated in the signal line driver circuit 101 to a first electrode of the capacitor 107. In other words, the potential of the first image signal is applied to the first electrode of the capacitor 107 when the switch SW1 is on, and the potential of the first image signal is not applied to the first electrode of the capacitor 107 when the switch SW1 is off. In addition, the potential of the second image signal generated in the signal line driver circuit 101 is not applied to the first electrode of the capacitor 107 when the switch SW1 is off.

The reference potential Vcom is applied to a second electrode of the capacitor 107, and the capacitor 107 has a function of holding the potential of the first image signal that is applied to the first electrode of the capacitor 107 through the switch SW1.

In the first selection circuit 104, the switch SW2 has a function of controlling output of the potential of the first image signal held in the capacitor 107 from the selection circuit 102. In other words, the potential of the first image signal is output from the selection circuit 102 when the switch SW2 is on, and the potential of the first image signal is not output from the selection circuit 102 when the switch SW2 is off. The potential of the first image signal that is output from the selection circuit 102 is applied to a capacitor 109 added to the signal line 106.

In the second selection circuit 105, the switch SW3 has a function of controlling input of the second image signal generated in the signal line driver circuit 101 to a first electrode of the capacitor 108. In other words, the potential of the second image signal is applied to the first electrode of the capacitor 108 when the switch SW3 is on, and the potential of the second image signal is not applied to the first electrode of the capacitor 108 when the switch SW3 is off. In addition, the potential of the first image signal generated in the signal line driver circuit 101 is not applied to the first electrode of the capacitor 108 when the switch SW3 is off.

In the second selection circuit 105, the switch SW4 has a function of controlling application of the reference potential Vcom to the first electrode of the capacitor 108. In other words, the reference potential Vcom is applied to the first electrode of the capacitor 108 when the switch SW4 is on, and the reference potential Vcom is not applied to the first electrode of the capacitor 108 when the switch SW4 is off.

The capacitor 108 has a function of holding the potential of the second image signal that is applied to the first electrode of the capacitor 108 through the switch SW3.

In the second selection circuit 105, the switch SW5 has a function of controlling output of the potential of a second electrode of the capacitor 108 from the selection circuit 102. In other words, the potential of the second electrode of the capacitor 108 is output from the selection circuit 102 when the switch SW5 is on, and the potential of the second electrode of the capacitor 108 is not output from the selection circuit 102 when the switch SW5 is off. The potential of the second electrode of the capacitor 108 that is output from the selection circuit 102 is applied to the capacitor 109 added to the signal line 106.

In the second selection circuit 105, the switch SW6 has a function of controlling application of the reference potential Vcom to the second electrode of the capacitor 108. In other words, the reference potential Vcom is applied to the second electrode of the capacitor 108 when the switch SW6 is on, and the reference potential Vcom is not applied to the second electrode of the capacitor 108 when the switch SW6 is off.

Figure 3A:
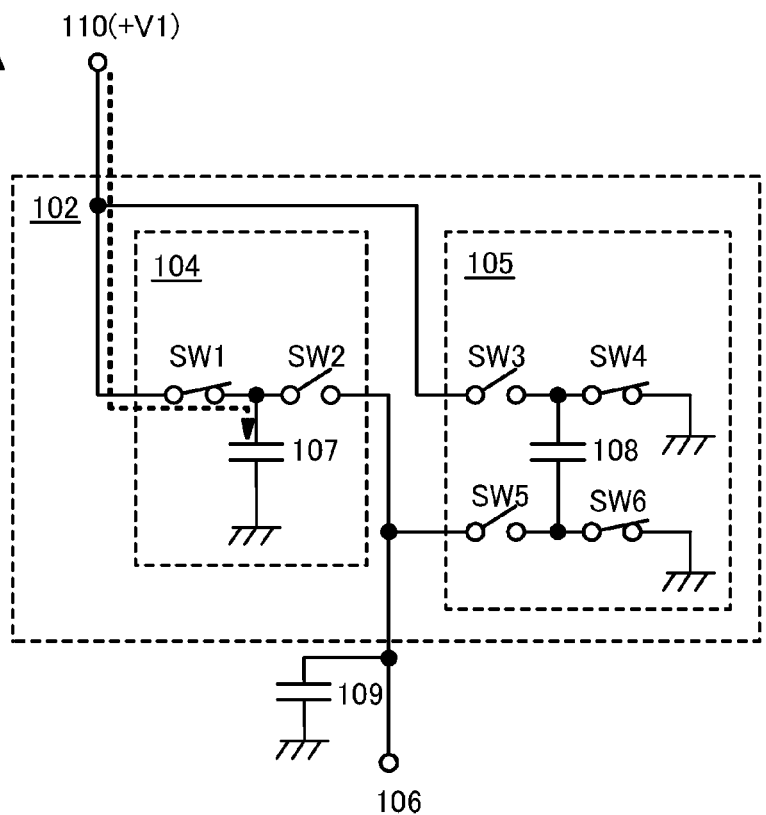
FIGS. 3A and 3B each illustrate operation of the selection circuit.
Figure 3B:
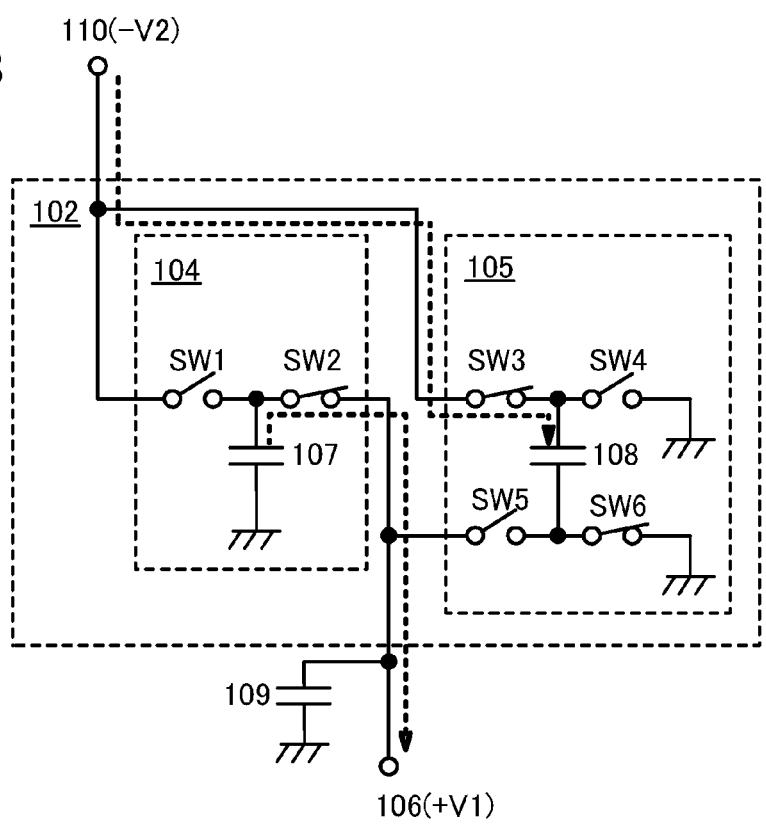
Figure 4:
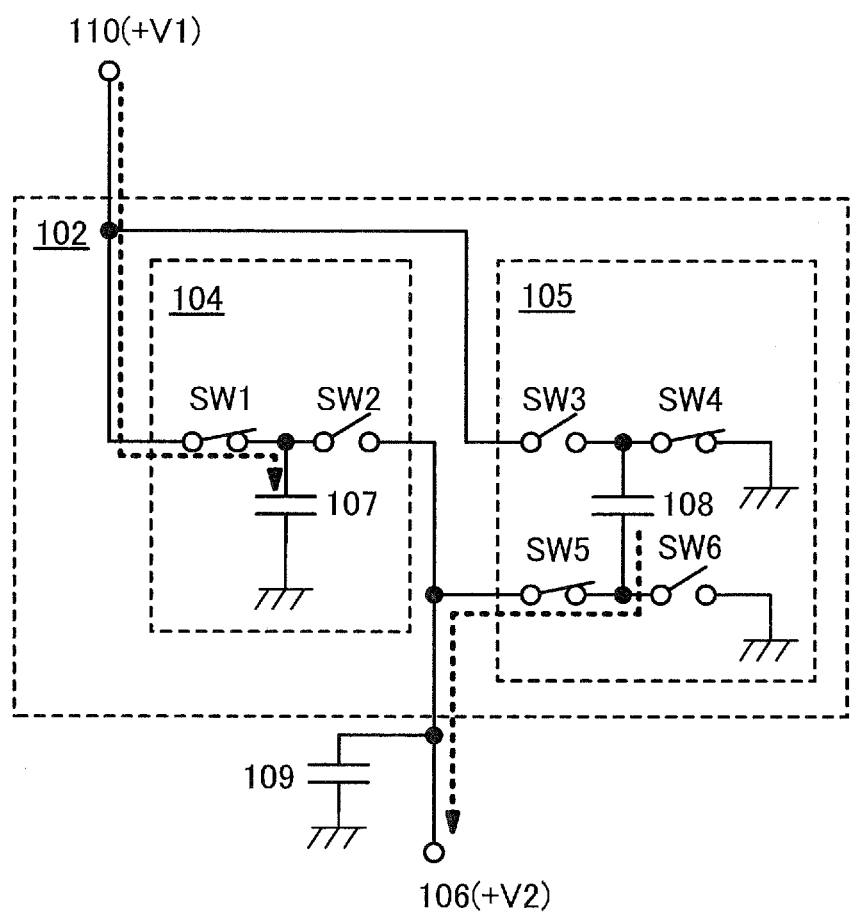
FIG. 4 illustrates operation of the selection circuit.

Next, operation examples of the selection circuit 102 in FIG. 2 are described. FIGS. 3A and 3B and FIG. 4 schematically illustrate operation examples of the selection circuit 102.

First, as illustrated in FIG. 3A, the first image signal having the potential +V1 and a positive polarity is input from the signal line driver circuit 101 to the selection circuit 102 through a terminal 110. In FIG. 3A, in the first selection circuit 104, the switch SW1 is on, the switch SW2 is off, and the potential +V1 is applied to the first electrode of the capacitor 107 through the switch SW1. The reference potential Vcom is applied to the second electrode of the capacitor 107.

In FIG. 3A, in the second selection circuit 105, the switch SW3 is off. Thus, the potential +V1 of the first image signal having a positive polarity is not applied to the first electrode of the capacitor 108. In addition, in FIG. 3A, in the second selection circuit 105, the switch SW4 and the switch SW6 are on. Thus, the reference potential Vcom is applied to the first electrode and the second electrode of the capacitor 108 through the switch SW4 and the switch SW6. Further, in FIG. 3A, in the second selection circuit 105, the switch SW5 is off. Thus, the potential of the second electrode of the capacitor 108 is not applied to the signal line 106.

Next, as illustrated in FIG. 3B, the second image signal having the potential −V2 and a negative polarity is input from the signal line driver circuit 101 to the selection circuit 102 through the terminal 110. In FIG. 3B, in the first selection circuit 104, the switch SW1 is off; thus, the potential −V2 of the second image signal having a negative polarity is not applied to the first electrode of the capacitor 107. In addition, in FIG. 3B, in the first selection circuit 104, the switch SW2 is on and the potential +V1 is applied to the signal line 106 through the switch SW2. The reference potential Vcom is applied to the second electrode of the capacitor 107.

In FIG. 3B, in the second selection circuit 105, the switch SW3 is on and the switch SW4 is off. Thus, the potential −V2 of the second image signal having a negative polarity is applied to the first electrode of the capacitor 108 through the switch SW3. In addition, in FIG. 3B, in the second selection circuit 105, the switch SW5 is off and the switch SW6 is on. Thus, the reference potential Vcom is applied to the second electrode of the capacitor 108, and the potential of the second electrode of the capacitor 108 is not applied to the signal line 106. In other words, in FIG. 3B, the potential −V2 is applied to the first electrode of the capacitor 108, and the reference potential Vcom is applied to the second electrode of the capacitor 108.

Next, as illustrated in FIG. 4, the first image signal having the potential +V1 and a positive polarity is input from the signal line driver circuit 101 to the selection circuit 102 through the terminal 110. In FIG. 4, in the first selection circuit 104, the switch SW1 is on; thus, the potential +V1 of the first image signal having a positive polarity is applied to the first electrode of the capacitor 107 through the switch SW1. In addition, in FIG. 4, in the first selection circuit 104, the switch SW2 is off; thus, the potential of the first electrode of the capacitor 107 is not applied to the signal line 106. The reference potential Vcom is applied to the second electrode of the capacitor 107.

In FIG. 4, in the second selection circuit 105, the switch SW3 is off and the switch SW4 is on. Thus, the potential of the first electrode of the capacitor 108 changes from the potential −V2 to the reference potential Vcom. Accordingly, in accordance with the principle of conservation of charge, the potential of the second electrode of the capacitor 108 changes from the reference potential Vcom to the potential +V2. In addition, in FIG. 4, in the second selection circuit 105, the switch SW5 is on and the switch SW6 is off. Thus, the potential +V2 of the second electrode of the capacitor 108 is applied to the signal line 106. In other words, in FIG. 4, the potential +V2 of the second image signal having a positive polarity is applied to the signal line 106 from the selection circuit 102.

Note that the capacitor 109 is added to the signal line 106; thus, the potential of the signal line 106 is not necessarily equal to the potential applied to the signal line 106. In the case where the capacitance of the capacitor 108 is much higher than the capacitance of the capacitor 109, the potential of the signal line 106 can be substantially equal to the potential applied to the signal line 106. However, in the case where the capacitance of the capacitor 108 is not much higher than the capacitance of the capacitor 109, the potential of the signal line 106 is shifted from the potential applied to the signal line 106 to the reference potential Vcom side. For example, when the potential +V1 of the first image signal having a positive polarity or the potential +V2 of the second image signal having a positive polarity is applied to the signal line 106, the potential of the signal line 106 is shifted in a negative direction from the potential +V1 of the first image signal or the potential +V2 of the second image signal. The potential is shifted greatly when parasitic capacitance added to the signal line 106 is increased by extending the signal line 106 and the capacitance of the capacitor 109 becomes higher than the capacitance of the capacitor 108.

In one embodiment of the present invention, the selection circuit 102 can make the first image signal and the second image signal that are input to the signal line 106 have the same polarity. Thus, even when the polarities of the first image signal and the second image signal that are output from the signal line driver circuit 101 are different from each other, the luminance of the light-emitting element 103 can be determined in accordance with image information contained in the first image signal and the second image signal. Accordingly, the first image signal and the second image signal can contribute to image display in the light-emitting device 100.

In one embodiment of the present invention, the first image signal having a positive polarity is held in the capacitor 107 in the first selection circuit 104, the second image signal having a negative polarity is held in the capacitor 108 in the second selection circuit 105, and the polarity of the second image signal is converted into an opposite polarity. Thus, when the capacitance of the capacitor 107 becomes closer to the capacitance of the capacitor 108, a difference between delay time of the first image signal in the first selection circuit 104 and delay time of the second image signal in the second selection circuit 105 becomes smaller. In one embodiment of the present invention, with the above structure, the delay-time difference between the first image signal and the second image signal that are output from the selection circuit 102 can be reduced compared to the case where the first image signal having a positive polarity is not held in the first selection circuit 104 and is output from the selection circuit 102.

Next, a specific structure example of the selection circuit 102 where in the selection circuit 102 in FIG. 2, a transistor corresponding to a semiconductor element is used as a switch is described.

Figure 5:
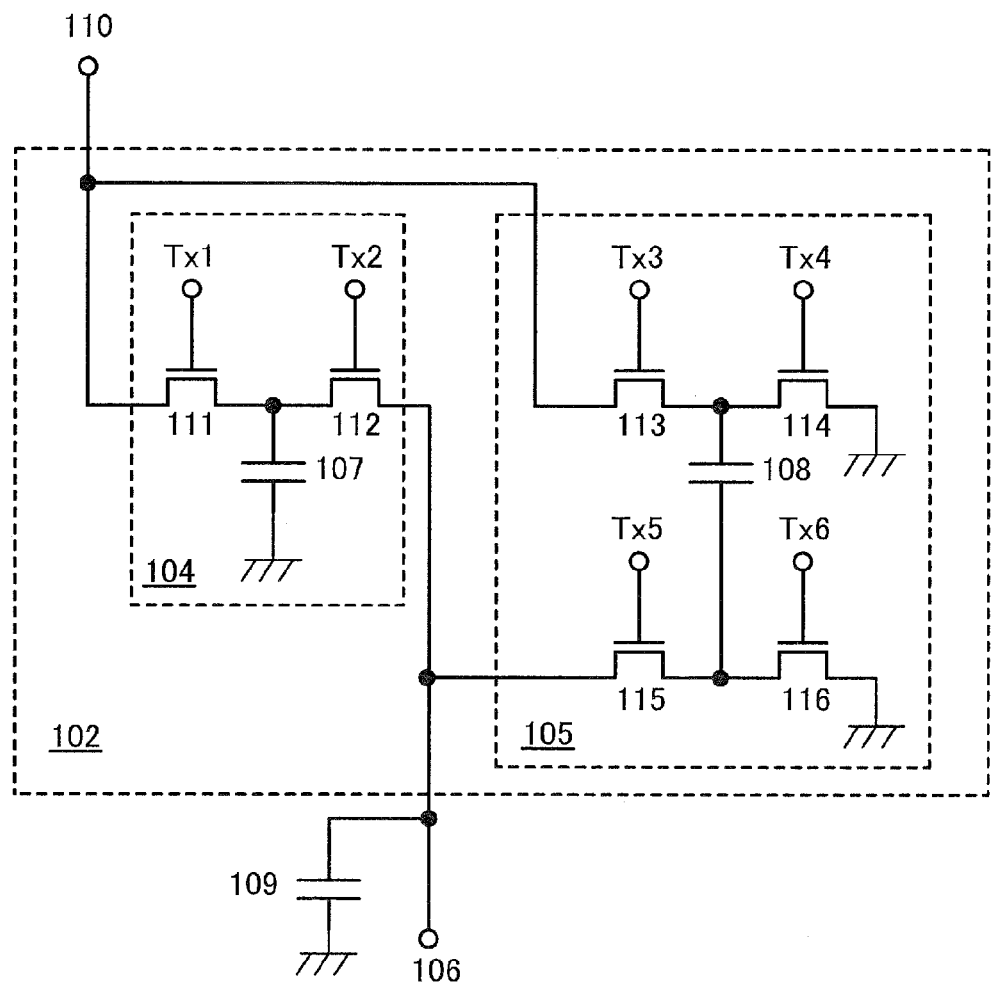
FIG. 5 illustrates a structure of the selection circuit.

FIG. 5 illustrates a structure example of the selection circuit 102 where a transistor is used as a switch. In the selection circuit 102 in FIG. 5, the first selection circuit 104 includes a transistor 111 functioning as the switch SW1, a transistor 112 functioning as the switch SW2, and the capacitor 107. In addition, in the selection circuit 102 in FIG. 5, the second selection circuit 105 includes a transistor 113 functioning as the switch SW3, a transistor 114 functioning as the switch SW4, a transistor 115 functioning as the switch SW5, a transistor 116 functioning as the switch SW6, and the capacitor 108.

Specifically, one of a source and a drain of the transistor 111 is connected to the terminal 110, and the other of the source and the drain of the transistor 111 is connected to the first electrode of the capacitor 107. A gate of the transistor 111 is connected to a terminal Tx1. One of a source and a drain of the transistor 112 is connected to the first electrode of the capacitor 107, and the other of the source and the drain of the transistor 112 is connected to the signal line 106. A gate of the transistor 112 is connected to a terminal Tx2. One of a source and a drain of the transistor 113 is connected to the terminal 110, and the other of the source and the drain of the transistor 113 is connected to the first electrode of the capacitor 108. A gate of the transistor 113 is connected to a terminal Tx3. One of a source and a drain of the transistor 114 is connected to the first electrode of the capacitor 108, and the other of the source and the drain of the transistor 114 is connected to a node to which the reference potential Vcom is applied. A gate of the transistor 114 is connected to a terminal Tx4. One of a source and a drain of the transistor 115 is connected to the signal line 106, and the other of the source and the drain of the transistor 115 is connected to the second electrode of the capacitor 108. A gate of the transistor 115 is connected to a terminal Tx5. One of a source and a drain of the transistor 116 is connected to the second electrode of the capacitor 108, and the other of the source and the drain of the transistor 116 is connected to a node to which the reference potential Vcom is applied. A gate of the transistor 116 is connected to a terminal Tx6.

Note that a source of a transistor means a source region that is part of a semiconductor film functioning as an active layer or a source electrode that is connected to the semiconductor film. Similarly, a drain of a transistor means a drain region that is part of the semiconductor film or a drain electrode that is connected to the semiconductor film. A gate means a gate electrode.

The terms "source" and "drain" of a transistor interchange with each other depending on the polarity of the transistor or levels of potentials applied to terminals. In general, in an n-channel transistor, a terminal to which a low potential is applied is called a source, and a terminal to which a high potential is applied is called a drain. Further, in a p-channel transistor, a terminal to which a low potential is applied is called a drain, and a terminal to which a high potential is applied is called a source. In this specification, although the connection relation of the transistor is described assuming that the source and the drain are fixed in some cases for convenience, actually, the names of the source and the drain interchange with each other depending on the relation of the potentials.

Figure 6:
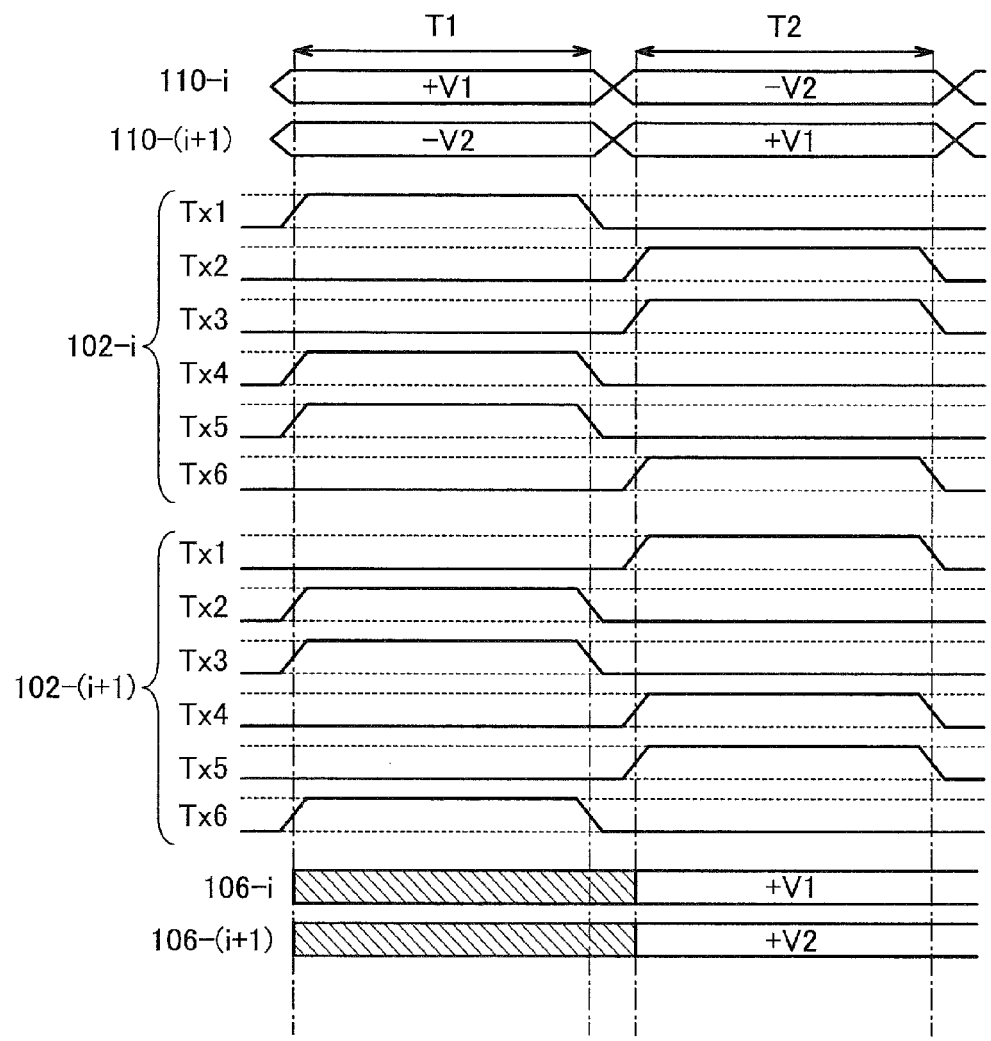
FIG. 6 is a timing chart.

Next, an operation example of the selection circuit 102 in FIG. 5 is described. FIG. 6 is an example of a timing chart of the selection circuit 102 in FIG. 5. Note that FIG. 6 is an example of a timing chart of a selection circuit 102-*i* in an i-th column that corresponds to an i-th signal line 106-*i* and a selection circuit 102-(*i*+1) in an (i+1)th column that corresponds to an (i+1)th signal line 106-(*i*+1). In FIG. 6, all the transistors 111 to 116 are n-channel transistors.

First, in a period T1 corresponding to a first frame period, the potential +V1 of the first image signal having a positive polarity is applied from the signal line driver circuit 101 to a terminal 110-*i*, and the potential −V2 of the second image signal having a negative polarity is applied from the signal line driver circuit 101 to a terminal 110-(*i*+1).

In the period T1, in the selection circuit 102-*i*, a high-level potential VDD is applied to the terminals Tx1, Tx4, and Tx5, and a low-level potential VSS is applied to the terminals Tx2, Tx3, and Tx6. Thus, the transistors 111, 114, and 115 are turned on, and the transistors 112, 113, and 116 are turned off. Thus, the potential +V1 of the first image signal having a positive polarity that is applied to the terminal 110-*i* is applied to the first electrode of the capacitor 107 in the first selection circuit 104.

In the period T1, in the selection circuit 102-(*i*+1), the high-level potential VDD is applied to the terminals Tx2, Tx3, and Tx6, and the low-level potential VSS is applied to the terminals Tx1, Tx4, and Tx5. Thus, the transistors 112, 113, and 116 are turned on, and the transistors 111, 114, and 115 are turned off. Thus, the potential −V2 of the second image signal having a negative polarity that is applied to the terminal 110-(*i*+1) is applied to the first electrode of the capacitor 108 in the second selection circuit 105.

Next, in a period T2 corresponding to a second frame period, in the selection circuit 102-*i*, the high-level potential VDD is applied to the terminals Tx2, Tx3, and Tx6, and the low-level potential VSS is applied to the terminals Tx1, Tx4, and Tx5. Thus, the transistors 112, 113, and 116 are turned on, and the transistors 111, 114, and 115 are turned off. Thus, the potential +V1 of the first image signal having a positive polarity that is applied to the first electrode of the capacitor 107 in the period T1 is applied from the first selection circuit 104 to the signal line 106-*i*.

In the period T2, in the selection circuit 102-(*i*+1), the high-level potential VDD is applied to the terminals Tx1, Tx4, and Tx5, and the low-level potential VSS is applied to the terminals Tx2, Tx3, and Tx6. Thus, the transistors 111, 114, and 115 are turned on, and the transistors 112, 113, and 116 are turned off. Thus, the polarity of the potential −V2 of the second image signal having a negative polarity that is applied to the first electrode of the capacitor 108 in the period T1 is inverted. Then, the potential +V2 of the second image signal having a positive polarity is applied from the second selection circuit 105 to the signal line 106-(*i*+1).

Note that FIG. 6 is a timing chart of the selection circuit 102 in which an image signal corresponding to one signal line and an image signal corresponding to one signal line adjacent to the signal line that are output from the signal line driver circuit 101 have opposite polarities in a given frame period. However, in the light-emitting device according to one embodiment of the present invention, image signals that are output from the signal line driver circuit 101 and correspond to all the signal lines may have the same polarity in one frame period, and image signals output from the signal line driver circuit 101 may have opposite polarities in adjacent frame periods.

Embodiment 2

FIG. 7 is a block diagram illustrating a structure example of a light-emitting device according to one embodiment of the present invention. A light-emitting device 200 in FIG. 7 includes a pixel portion 201 in which a light-emitting element is provided in each pixel, and driver circuits controlling the operation of the pixel portion 201. The light-emitting device 200 in FIG. 7 includes a scan line driver circuit 202, a signal line driver circuit 203, and a selection circuit 204 as the driver circuits.

The scan line driver circuit 202 has a function of selecting pixels included in the pixel portion 201. The signal line driver circuit 203 has a function of outputting an image signal having a positive polarity and an image signal having a negative polarity that correspond to pixels selected by the scan line driver circuit 202. The selection circuit 204 has a function of inverting the polarity of one of the image signal having a positive polarity and the image signal having a negative polarity that are output from the signal line driver circuit 203.

The signal line driver circuit 203 in FIG. 7 includes a shift register 205, a level shifter 206, a sampling circuit 207, an analog storage circuit 208, and an analog buffer 209. Note that the structure of the signal line driver circuit 203 in FIG. 7 corresponds to an example of a signal line driver circuit included in the light-emitting device according to one embodiment of the present invention. In one embodiment of the present invention, as illustrated in FIG. 7, a signal line driver circuit outputting analog image signals may be used, or a signal line driver circuit outputting digital image signals may be used.

Next, the operation of the light-emitting device 200 in FIG. 7 is described. In the signal line driver circuit 203, a clock signal and a start pulse signal are input to the shift register 205. The shift register 205 has a function of generating timing signals whose pulses are sequentially shifted, in response to the clock signal and the start pulse signal, and outputting the timing signals.

The level shifter 206 has a function of adjusting the amplitude of voltage of a timing signal output from the shift register 205. The timing signal whose amplitude is adjusted is transmitted to the sampling circuit 207. The sampling circuit 207 has a function of sampling an analog image signal in response to a timing signal transmitted from the level shifter 206. Specifically, the sampling circuit 207 has a function of acquiring the potential of an analog image signal while the pulse of a timing signal appears and holding the potential. In the case where the potential of the image signal is higher than the reference potential Vcom while the pulse of the timing signal appears, an image signal having a positive polarity is sampled. In the case where the potential of the image signal is lower than the reference potential Vcom while the pulse of the timing signal appears, an image signal having a negative polarity is sampled.

After image signals for one line period are all sampled, the sampled image signals are concurrently transmitted to the analog storage circuit 208 in response to latch signals and are held in the analog storage circuit 208. The image signals held in the analog storage circuit 208 are transmitted to the selection circuit 204 through the analog buffer 209.

Note that image signals may be sampled sequentially in corresponding signal lines, or pixels in one line may be divided into several groups and image signals may be sampled in each pixel corresponding to one group concurrently.

In parallel with transmission of image signals from the analog storage circuit 208 to the selection circuit 204, the sampling circuit 207 can sample image signals corresponding to the next line period again.

The selection circuit 204 holds an image signal transmitted from the analog storage circuit 208 and transmits the held image signal to the pixel portion 201 through the signal line. Alternatively, the selection circuit 204 holds an image signal transmitted from the analog storage circuit 208, inverts the polarity of the held image signal, and transmits the image signal whose polarity is inverted to the pixel portion 201 through the signal line.

In the scan line driver circuit 202, pixels included in the pixel portion 201 are selected for each line. The image signal transmitted from the selection circuit 204 to the pixel portion 201 through the signal line is input to pixels in a line selected in the scan line driver circuit 202.

Note that a circuit which can output signals whose pulses are sequentially shifted may be used instead of the shift register 205.

Note that in the light-emitting device 200 in FIG. 7, an image signal input to the pixel portion 201 is an analog image signal. In the case where the image signal input to the pixel portion 201 is not an analog image signal but a digital image signal, grayscale display can be performed in the pixel portion 201 by, for example, an area ratio grayscale method or a time ratio grayscale method. An area ratio grayscale method is a driving method in which one pixel is divided into a plurality of subpixels and the subpixels are driven based on corresponding bits of an image signal so that grayscale display is performed. Further, a time ratio grayscale method is a driving method in which the ratio of a period during which a pixel displays a bright image to a period during which a pixel displays a dark image is controlled so that grayscale display is performed.

In the case where the signal line driver circuit 203 is formed over an IC chip, chip on glass (COG), wire bonding, tape automated bonding (TAB), or the like can be used as a method for connecting the signal line driver circuit 203 to the selection circuit 204. Alternatively, a chip on film (COF) method, a tape carrier package (TCP) method by which a circuit is mounted on a TAB tape, or the like may be used.

Figure 10A:
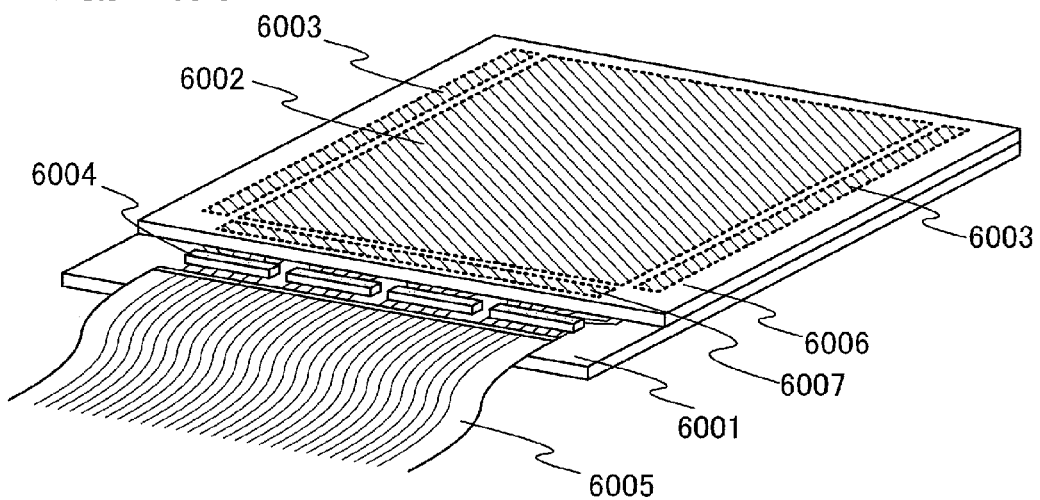
FIGS. 10A and 10B are perspective views of light-emitting devices.
Figure 10B:
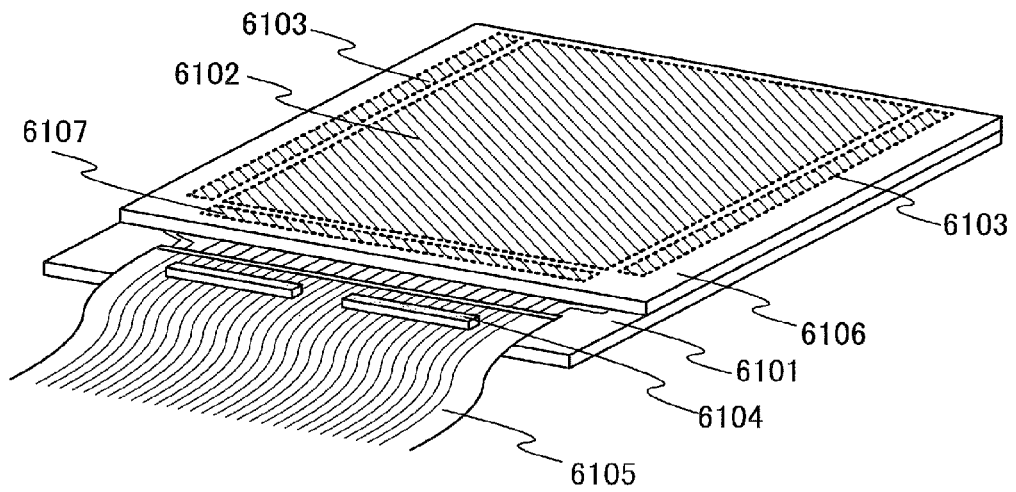

Each of FIGS. 10A and 10B is a perspective view of a light-emitting device in which a chip-like substrate provided with a signal line driver circuit is mounted on a second substrate provided with a selection circuit and a pixel portion.

In the light-emitting device in FIG. 10A, a pixel portion 6002, a scan line driver circuit 6003, and a selection circuit 6007 are provided between substrates 6001 and 6006. A substrate 6004 provided with a signal line driver circuit is directly mounted on the substrate 6001. Note that the scan line driver circuit 6003 and the selection circuit 6007 are not necessarily positioned between the substrates 6001 and 6006. The scan line driver circuit 6003 and the selection circuit 6007 may be provided in a region over the substrate 6001 that does not overlap with the substrate 6006.

Specifically, the signal line driver circuit formed over the substrate 6004 is attached to the substrate 6001 and is electrically connected to the selection circuit 6007. Further, a power supply potential, a variety of signals, and the like are supplied through a flexible printed circuit (FPC) 6005 to the pixel portion 6002, the scan line driver circuit 6003, the selection circuit 6007, and the signal line driver circuit formed over the substrate 6004.

In the light-emitting device in FIG. 10B, a pixel portion 6102, a scan line driver circuit 6103, and a selection circuit 6107 are provided between substrates 6101 and 6106. A substrate 6104 provided with a signal line driver circuit is mounted on an FPC 6105 connected to the substrate 6101. Note that the scan line driver circuit 6103 and the selection circuit 6107 are not necessarily positioned between the substrates 6101 and 6106. The scan line driver circuit 6103 and the selection circuit 6107 may be provided in a region over the substrate 6101 that does not overlap with the substrate 6106.

A power supply potential, a variety of signals, and the like are supplied through the FPC 6105 to the pixel portion 6102, the scan line driver circuit 6103, the selection circuit 6107, and the signal line driver circuit formed over the substrate 6104.

There is no particular limitation on a method for mounting the substrate provided with the signal line driver circuit, and a known method such as COG, wire bonding, or TAB can be used. A position where the substrate provided with the signal line driver circuit is mounted is not limited to the position shown in FIG. 10A or 10B as long as electrical connection is possible. Further, a controller, a CPU, a memory, or the like may be formed using an IC chip and may be mounted on the substrate provided with the selection circuit and the pixel portion.

This embodiment can be combined with the above embodiment.

Embodiment 3

In this embodiment, a specific structure example of a pixel of a light-emitting device according to one embodiment of the present invention is described. Note that a transistor in the pixel corresponds to a semiconductor element in one embodiment of the present invention.

Figure 8A:
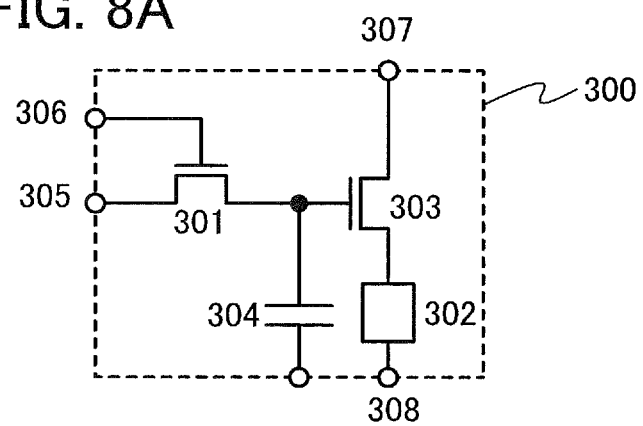
FIGS. 8A and 8B are pixel circuit diagrams.

FIG. 8A shows an example of a circuit diagram of a pixel 300. The pixel 300 includes a transistor 301 controlling input of an image signal to the pixel 300, a light-emitting element 302, a transistor 303 controlling the value of current supplied to the light-emitting element 302 in response to an image signal, and a capacitor 304 for holding the potential of an image signal.

The potential of one of an anode and a cathode of the light-emitting element 302 is controlled in response to an image signal input to the pixel 300. The reference potential Vcom is applied to the other of the anode and the cathode of the light-emitting element 302. The luminance of the light-emitting element 302 is determined by a potential difference between the anode and the cathode. In each of the plurality of pixels 300 included in the pixel portion, the luminance of the light-emitting element 302 is adjusted in response to an image signal containing image information, so that an image is displayed on the pixel portion.

Next, connection of the transistor 301, the transistor 303, the capacitor 304, and the light-emitting element 302 which are included in the pixel 300 is described.

One of a source and a drain of the transistor 301 is connected to a signal line 305, and the other of the source and the drain of the transistor 301 is connected to a gate of the transistor 303. A gate of the transistor 301 is connected to a wiring 306. One of a source and a drain of the transistor 303 is connected to a wiring 307, and the other of the source and the drain of the transistor 303 is connected to the light-emitting element 302. Specifically, the other of the source and the drain of the transistor 303 is connected to one of the anode and the cathode of the light-emitting element 302. The other of the anode and the cathode of the light-emitting element 302 is connected to a wiring 308 to which the reference potential Vcom is applied.

Note that in FIG. 8A, the pixel 300 includes the capacitor 304. However, for example, in the case where gate capacitance generated between the gate and an active layer of the transistor 301 or gate parasitic capacitance is high, i.e., the case where the potential of an image signal can be sufficiently held by another capacitor, the capacitor 304 is not necessarily provided in the pixel 300.

Figure 8B:
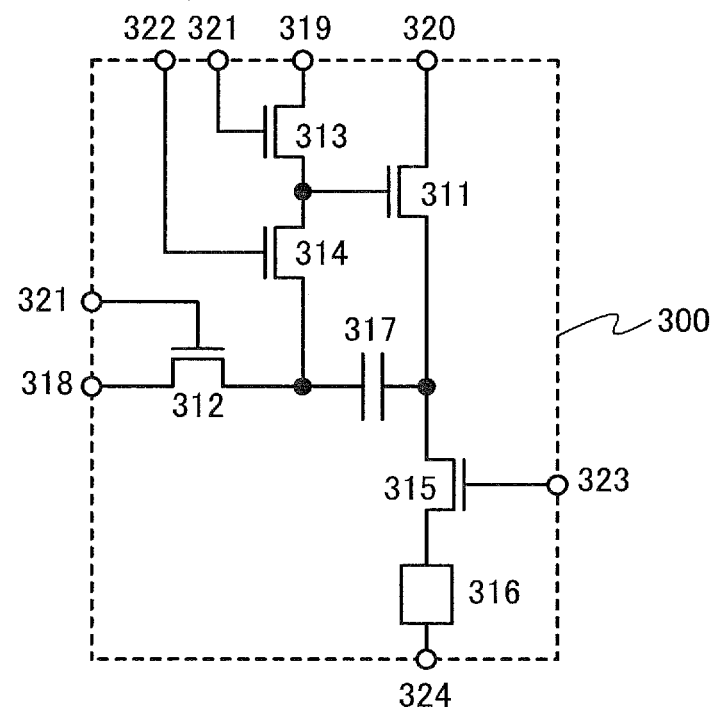

FIG. 8B is another example of the pixel 300.

FIG. 8B is an example of a circuit diagram of the pixel 300. The pixel 300 includes transistors 311 to 315, a light-emitting element 316, and a capacitor 317.

The transistor 312 has a function of controlling connection between a signal line 318 and one of a pair of electrodes of the capacitor 317. The other of the pair of electrodes of the capacitor 317 is connected to one of a source and a drain of the transistor 311. The transistor 313 has a function of controlling connection between a wiring 319 and a gate of the transistor 311. The transistor 314 has a function of controlling connection between one of the pair of electrodes of the capacitor 317 and the gate of the transistor 311. The transistor 315 has a function of controlling connection between one of the source and the drain of the transistor 311 and one of an anode and a cathode of the light-emitting element 316.

In FIG. 8B, the other of the source and the drain of the transistor 311 is connected to a wiring 320.

The on/off state of the transistor 312 is determined by the potential of a wiring 321 connected to a gate of the transistor 312. The on/off state of the transistor 313 is determined by the potential of the wiring 321 connected to a gate of the transistor 313. The on/off state of the transistor 314 is determined by the potential of a wiring 322 connected to a gate of the transistor 314. The on/off state of the transistor 315 is determined by the potential of a wiring 323 connected to a gate of the transistor 315. The other of the anode and the cathode of the light-emitting element 316 is connected to a wiring 324 to which the reference potential Vcom is applied.

Note that in FIGS. 8A and 8B, the pixel 300 may further include another circuit element such as a transistor, a diode, a resistor, a capacitor, or an inductor as needed.

In FIGS. 8A and 8B, the transistors each have the gate on at least one side of a semiconductor film; alternatively, the transistors may each have a pair of gates with a semiconductor film positioned therebetween. When one of the pair of gates is regarded as a back gate, the back gate may be floating or may be supplied with a potential from another element. In the latter case, potentials at the same level may be applied to a normal gate and the back gate, or a fixed potential such as a ground potential may be applied only to the back gate. By controlling the level of the potential applied to the back gate, the threshold voltage of the transistor can be controlled. By providing the back gate, a channel formation region is enlarged and drain current can be increased. Further, provision of the back gate facilitates formation of a depletion layer in the semiconductor film, which results in lower subthreshold swing.

The transistors in FIGS. 8A and 8B are all n-channel transistors. When the transistors in the pixel 300 have the same polarity, it is possible to simplify steps of forming the transistors.

In the case where the transistor 303 operates in a saturation region, its channel length or channel width is preferably larger than those of transistors other than the transistor 303 in the pixel 300. An increase in channel width reduces the kink effect and flattens the value of drain current with respect to voltage between a source and a drain in the saturation region. Alternatively, the increase in channel length makes a large amount of current flow through the transistor 303 even in the saturation region.

In FIGS. 8A and 8B, the transistors in the pixel 300 each have a single-gate structure including one gate and one channel formation region in one semiconductor film; however, the present invention is not limited to this structure. Any or all of the transistors in the pixel 300 may have a multi-gate structure including a plurality of gates electrically connected to each other and a plurality of channel formation regions in one semiconductor film.

Figure 9:
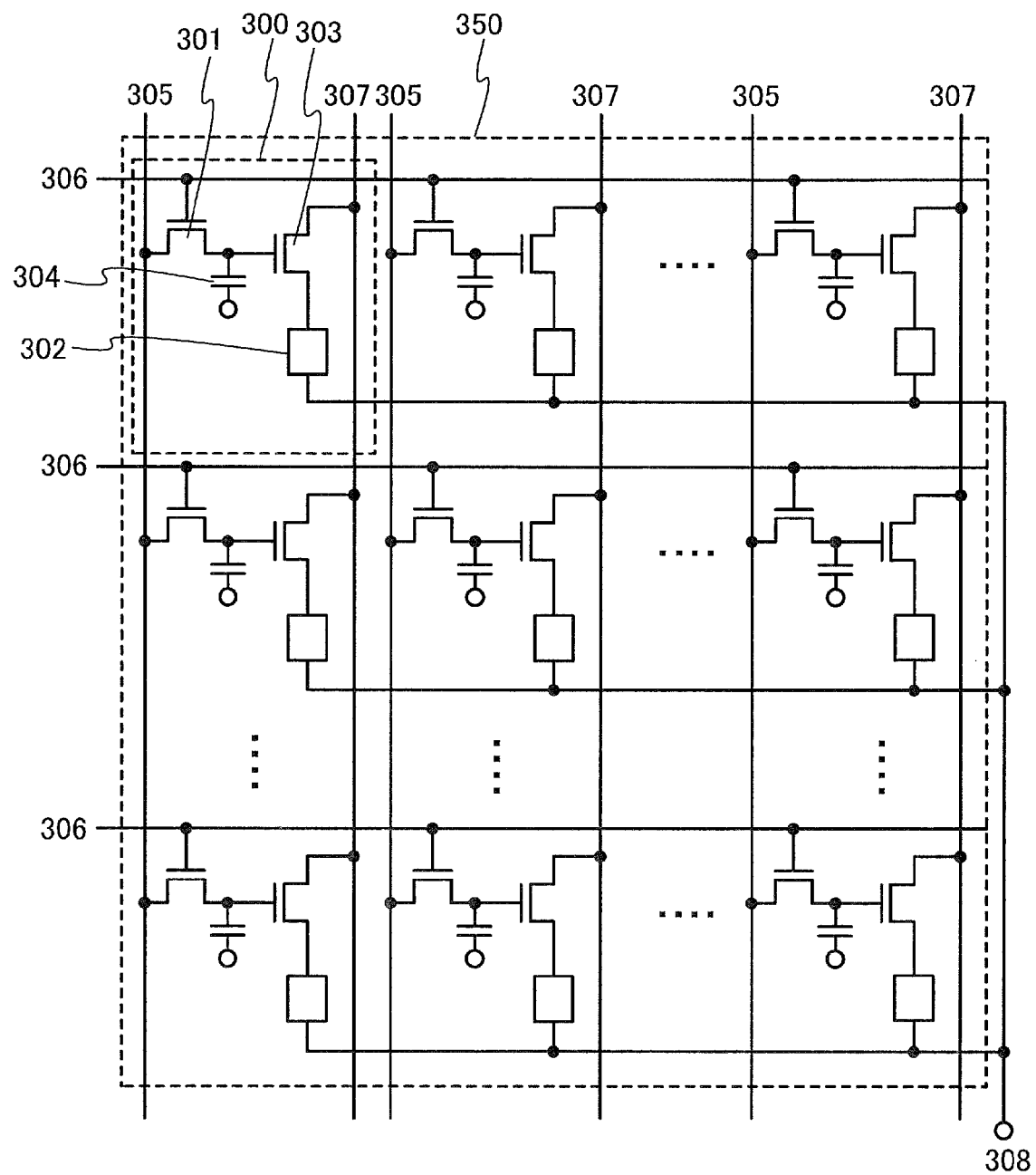
FIG. 9 illustrates a structure of a pixel portion.

Next, a structure example of a pixel portion 350 is described giving the example of the pixel 300 in FIG. 8A. FIG. 9 is an example of a specific circuit diagram of the pixel portion 350.

As illustrated in FIG. 9, the pixel portion 350 includes the plurality of signal lines 305, the plurality of wirings 306, the plurality of wirings 307, and the wiring 308. The plurality of signal lines 305 are connected to a selection circuit, and the plurality of wirings 306 are connected to a scan line driver circuit.

Each pixel 300 is connected to one of the plurality of signal lines 305, one of the plurality of wirings 306, and one of the plurality of wirings 307. All the pixels 300 are connected to the wiring 308.

In the pixel portion 350 in FIG. 9, the plurality of wirings 306 are sequentially selected when image signals are input to the pixels 300. In the pixel 300 connected to the selected wiring 306, the transistor 301 whose gate is connected to the wiring 306 is turned on. The potential of an image signal input to each of the plurality of signal lines 305 is applied to the gate of the transistor 303 when the transistor 301 is turned on. After the selection of the wirings 306 is terminated, the transistor 301 is turned off, and the potential of the image signal is held in the gate of the transistor 303.

The light-emitting state of the light-emitting element 302 is determined by the potential of the image signal. Specifically, when the transistor 303 is turned on in response to the potential of the image signal, the light-emitting element 302 is supplied with current and then is in the light-emitting state. When the transistor 303 is turned off in response to the potential of the image signal, the light-emitting element 302 is not supplied with current and is in the non-light-emitting state.

With the above operation, the pixel portion 350 can display an image.

Note that a transistor included in the pixel 300 may include a channel formation region in a semiconductor film of amorphous, microcrystalline, polycrystalline, or single crystal silicon, germanium, or the like. Alternatively, the transistor may include a channel formation region in a semiconductor film whose bandgap is wider than that of silicon and whose intrinsic carrier density is lower than that of silicon. Any of the following can be used as silicon: amorphous silicon formed by sputtering or vapor deposition such as plasma-enhanced CVD; polycrystalline silicon obtained in such a manner that amorphous silicon is crystallized by laser annealing or the like; single crystal silicon obtained in such a manner that a surface portion of a single crystal silicon wafer is separated by implantation of hydrogen ions or the like into the silicon wafer; and the like.

A highly-purified oxide semiconductor (a purified oxide semiconductor) obtained by reduction of impurities such as moisture or hydrogen that serve as electron donors (donors) and reduction of oxygen vacancies is an intrinsic (i-type) semiconductor or a substantially intrinsic semiconductor. Thus, a transistor including a channel formation region in a highly-purified oxide semiconductor film has extremely low off-state current.

Specifically, various experiments can prove low off-state current of a transistor including a channel formation region in a highly-purified oxide semiconductor film. For example, even when an element has a channel width of $1 \times 10^6$ µm and a channel length of 10 µm, off-state current can be lower than or equal to the measurement limit of a semiconductor parameter analyzer, i.e., lower than or equal to $1\times10^{-13}$ A, at a voltage (drain voltage) between a source and a drain of 1 to 10 V. In that case, it can be seen that off-state current normalized on the channel width of the transistor is lower than or equal to 100 zA/μm. In addition, a capacitor and a transistor were connected to each other and off-state current was measured using a circuit in which electric charge flowing to or from the capacitor is controlled by the transistor. In the measurement, a highly-purified oxide semiconductor film was used in the channel formation region of the transistor, and the off-state current of the transistor was measured from a change in the amount of electric charge of the capacitor per unit hour. As a result, it can be seen that, in the case where the voltage between a source electrode and a drain electrode of the transistor is 3 V, a lower off-state current of several tens of yoctoamperes per micrometer is obtained. Accordingly, the transistor including the highly-purified oxide semiconductor film in the channel formation region has much lower off-state current than a crystalline silicon transistor.

Among the oxide semiconductors, unlike silicon carbide, gallium nitride, or gallium oxide, an In—Ga—Zn-based oxide, an In—Sn—Zn-based oxide, or the like has an advantage of high mass productivity because a transistor with favorable electrical characteristics can be formed by sputtering or a wet process. Further, unlike silicon carbide, gallium nitride, or gallium oxide, with the use of the In—Ga—Zn-based oxide, a transistor with favorable electrical characteristics can be formed over a glass substrate. Furthermore, a larger substrate can be used.

An oxide semiconductor preferably contains at least indium (In) or zinc (Zn). As a stabilizer for reducing variations in electrical characteristics of a transistor including the oxide semiconductor, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, indium oxide; gallium oxide; tin oxide; zinc oxide; a binary metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a ternary metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a quaternary metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used as an oxide semiconductor.

Note that, for example, an In—Ga—Zn-based oxide means an oxide containing In, Ga, and Zn, and there is no limitation on the ratio of In, Ga, and Zn. In addition, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Further, the In—Ga—Zn-based oxide has high mobility.

For example, an In—Ga—Zn-based oxide with an atomic ratio of In:Ga:Zn=1:1:1 (=$\frac{1}{3}$:$\frac{1}{3}$:$\frac{1}{3}$) or In:Ga:Zn=2:2:1 (=$\frac{2}{5}$:$\frac{2}{5}$:$\frac{1}{5}$), or an oxide whose composition is in the neighborhood of the above composition can be used. Alternatively, an In—Sn—Zn-based oxide with an atomic ratio of In:Sn:Zn=1:1:1 (=$\frac{1}{3}$:$\frac{1}{3}$:$\frac{1}{3}$), In:Sn:Zn=2:1:3 (=$\frac{1}{3}$:$\frac{1}{6}$:$\frac{1}{2}$), or In:Sn:Zn=2:1:5 (=$\frac{1}{4}$:$\frac{1}{8}$:$\frac{5}{8}$), or an oxide whose composition is in the neighborhood of the above composition is preferably used.

For example, with an In—Sn—Zn-based oxide, high mobility can be comparatively easily obtained. However, even with an In—Ga—Zn-based oxide, mobility can be increased by lowering defect density in a bulk.

The structure of an oxide semiconductor film is described below.

An oxide semiconductor film is roughly classified into a single-crystal oxide semiconductor film and a non-single-crystal oxide semiconductor film. The non-single-crystal oxide semiconductor film means any of an amorphous oxide semiconductor film, a microcrystalline oxide semiconductor film, a polycrystalline oxide semiconductor film, a c-axis aligned crystalline oxide semiconductor (CAAC-OS) film, and the like.

The microcrystalline oxide semiconductor film includes a microcrystal (also referred to as nanocrystal) of greater than or equal to 1 nm and less than 10 nm, for example. Thus, the microcrystalline oxide semiconductor film has higher degree of atomic order than the amorphous oxide semiconductor film. Hence, the density of defect states of the microcrystalline oxide semiconductor film is lower than that of the amorphous oxide semiconductor film.

The amorphous oxide semiconductor film has disordered atomic arrangement and no crystalline component. A typical example the amorphous oxide semiconductor film is an oxide semiconductor film in which no crystal part exists even in a microscopic region, and the whole of the film is amorphous.

The CAAC-OS film is one of oxide semiconductor films including a plurality of crystal parts, and most of the crystal parts each fit into a cube whose one side is less than 100 nm. Thus, there is a case where a crystal part included in the CAAC-OS film fits into a cube whose one side is less than 10 nm, less than 5 nm, or less than 3 nm The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

In this specification, a term "perpendicular" indicates that an angle formed between two straight lines is 80 to 100°, and accordingly includes the case where the angle is 85 to 95°. In addition, a term "parallel" indicates that an angle formed between two straight lines is −10 to 10°, and accordingly includes the case where the angle is −5 to 5°.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts.

From the results of the cross-sectional TEM image and the planar TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer which is arranged in a layered manner and observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

Further, the crystallinity in the CAAC-OS film is not necessarily uniform. For example, in the case where crystal growth leading to the CAAC-OS film occurs from the vicinity of the top surface of the film, the crystallinity in the vicinity of the top surface is higher than that in the vicinity of the formation surface in some cases. Further, when an impurity is added to the CAAC-OS film, the crystallinity in a region to which the impurity is added is changed, and the crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor including the CAAC-OS film, changes in electrical characteristics of the transistor due to irradiation with visible light or ultraviolet light are small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

By using the transistor 301 whose off-state current is extremely low in the pixel 300 in FIG. 8A and using the transistors 312, 313, and 314 whose off-state current is extremely low in the pixel 300 in FIG. 8B, a period during which the potential of the gate of the transistor 303 or 311 is held can be longer. Thus, for example, in the case where image signals having the same image information are written to the pixel portion for some consecutive frame periods, as in a still image, an image can be continuously displayed even when drive frequency is lowered, that is, the writing number of an image signal for a certain period is reduced. For example, by using the transistor 312 including a highly purified oxide semiconductor in an active layer, the write cycle of an image signal can be 10 seconds or longer, preferably 30 seconds or longer, more preferably 1 minute or longer. As the write cycle of an image signal is made longer, power consumption can be further reduced.

In addition, since the potential of an image signal can be held for a longer period in FIG. 8A, the quality of an image to be displayed can be prevented from being lowered even when the capacitor 304 for holding the potential of the image signal is not connected to the gate of the transistor 303. Thus, it is possible to increase the aperture ratio by omitting the capacitor 304 or reducing the size of the capacitor 304, which leads to a reduction in power consumption of the light-emitting device.

Embodiment 4

In this embodiment, a bottom-emission structure, a top-emission structure, and a dual-emission structure are described. In the dual-emission structure, light from a light-emitting element is extracted from a substrate side provided with a transistor and a side opposite to the substrate. Note that in this embodiment, a pair of electrodes of a light-emitting element serves as an anode and a cathode.

Figure 11A:
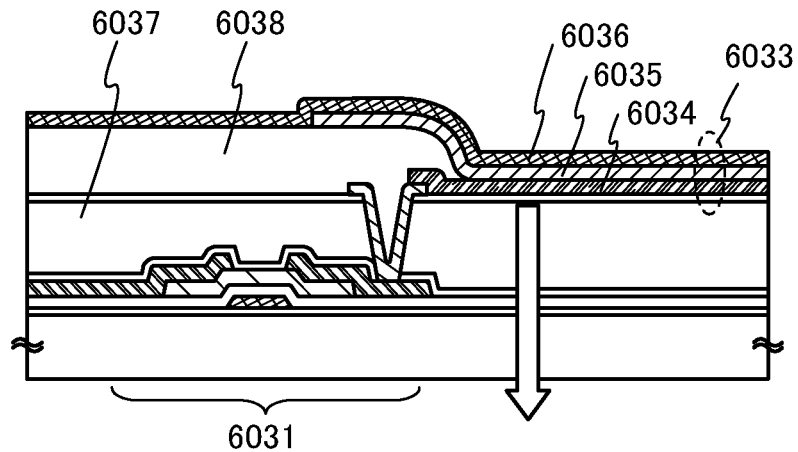
FIGS. 11A to 11C are cross-sectional views of pixels.

FIG. 11A is a cross-sectional view of a pixel in which light emitted from a light-emitting element 6033 is extracted from an electrode 6034 side. A transistor 6031 is covered with an insulating film 6037, and a bank 6038 having an opening is formed over the insulating film 6037. In the opening of the bank 6038, the electrode 6034 is partly exposed, and the electrode 6034, an EL layer 6035, and an electrode 6036 are stacked in that order in the opening.

The electrode 6034 is formed using a material through which light passes easily or formed to a thickness such that light passes through the electrode 6034 easily. The electrode 6036 is formed using a material through which light does not easily pass or formed to a thickness such that light does not easily pass through the electrode 6036. Accordingly, it is possible to obtain a bottom-emission structure in which light is extracted from the electrode 6034 side as indicated by an outline arrow.

Figure 11B:
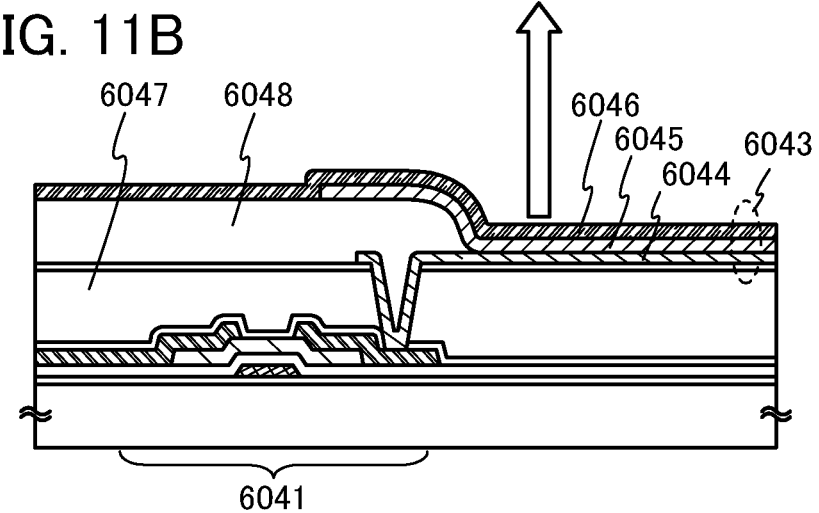

FIG. 11B is a cross-sectional view of a pixel in which light emitted from a light-emitting element 6043 is extracted from an electrode 6046 side. A transistor 6041 is covered with an insulating film 6047, and a bank 6048 having an opening is formed over the insulating film 6047. In the opening of the bank 6048, an electrode 6044 is partly exposed, and the electrode 6044, an EL layer 6045, and the electrode 6046 are stacked in that order in the opening.

The electrode 6044 is formed using a material through which light does not easily pass or formed to a thickness such that light does not easily pass through the electrode 6044. The electrode 6046 is formed using a material through which light passes easily or formed to a thickness such that light passes through the electrode 6046 easily. Accordingly, it is possible to obtain a top-emission structure in which light is extracted from the electrode 6046 side as indicated by an outline arrow.

Figure 11C:
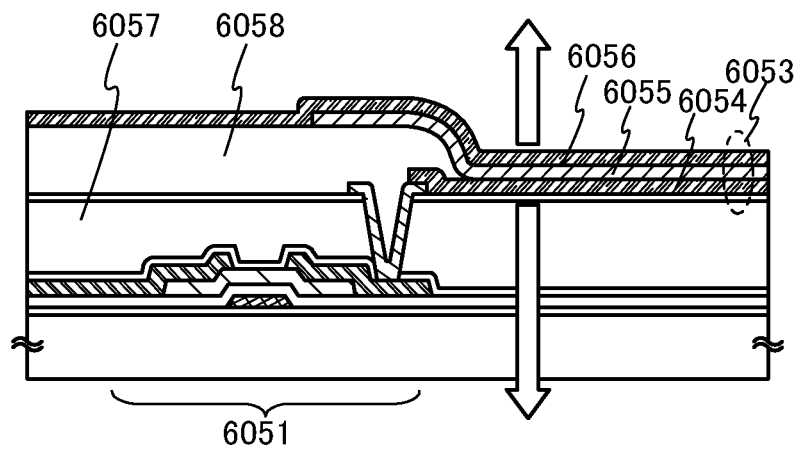

FIG. 11C is a cross-sectional view of a pixel in which light emitted from a light-emitting element 6053 is extracted from an electrode 6054 side and an electrode 6056 side. A transistor 6051 is covered with an insulating film 6057, and a bank 6058 having an opening is formed over the insulating film 6057. In the opening of the bank 6058, the electrode 6054 is partly exposed, and the electrode 6054, an EL layer 6055, and the electrode 6056 are stacked in that order in the opening.

The electrode 6054 and the electrode 6056 are formed using a material through which light passes easily or formed to a thickness such that light passes through the electrode 6054 and the electrode 6056 easily. Accordingly, it is possible to obtain a dual-emission structure in which light is extracted from the electrode 6054 side and the electrode 6056 side as indicated by outline arrows.

For the electrode serving as an anode or a cathode, any of metals, alloys, electrically conductive compounds, and mixtures thereof can be used, for example. Specific examples are indium oxide-tin oxide (indium tin oxide (ITO)), indium oxide-tin oxide containing silicon or silicon oxide, indium oxide-zinc oxide (indium zinc oxide), indium oxide containing tungsten oxide and zinc oxide, gold (Au), platinum (Pt), nickel (Ni), tungsten (W), chromium (Cr), molybdenum (Mo), iron (Fe), cobalt (Co), copper (Cu), palladium (Pd), and titanium (Ti). Other examples are elements that belong to Group 1 or 2 in the periodic table, for example, an alkali metal such as lithium (Li) or cesium (Cs), an alkaline earth metal such as calcium (Ca) or strontium (Sr), magnesium (Mg), an alloy containing such an element (e.g., MgAg or AlLi), a rare earth metal such as europium (Eu) or ytterbium (Yb), an alloy containing such an element, and graphene. The electrode is formed using a material selected from the above as appropriate and formed to an optimum thickness, so that a top-emission structure, a bottom-emission structure, or a dual-emission structure can be selectively formed.

In a light-emitting device according to one embodiment of the present invention, it is possible to employ a color filter method in which full-color images are displayed using a combination of a color filter and a light-emitting element that emits light of a single color such as white. Alternatively, it is possible to employ a method in which full-color images are displayed using a plurality of light-emitting elements that emit light of different hues. This method is referred to as a separate coloring method because EL layers each provided between a pair of electrodes of a light-emitting element are separately colored with corresponding colors.

In the separate coloring method, in general, EL layers are separately applied by vapor deposition with the use of a mask such as a metal mask. Thus, the size of pixels depends on the accuracy of separate coloring of the EL layers by vapor deposition. On the other hand, unlike the separate coloring method, EL layers do not need to be separately applied in the color filter method. Accordingly, pixels can be downsized more easily compared to the separate coloring method; thus, a high-definition pixel portion can be provided.

In the top-emission structure, light emitted from a light-emitting element is not blocked by an element such as a wiring, a transistor, or a capacitor, so that the efficiency of light extraction from a pixel can be made higher than that in the bottom-emission structure. Thus, the top-emission structure can achieve high luminance even when the value of current supplied to a light-emitting element is decreased, and thus is advantageous in improving the lifetime of the light-emitting element.

The light-emitting device according to one embodiment of the present invention may have a microcavity (micro optical resonator) structure in which light emitted from an EL layer resonates in a light-emitting element. With the microcavity structure, light having a specific wavelength can be extracted from the light-emitting element with high efficiency, so that the luminance and color purity of the pixel portion can be improved.

This embodiment can be combined with any of the other embodiments as appropriate.

Embodiment 5

Figure 12A:
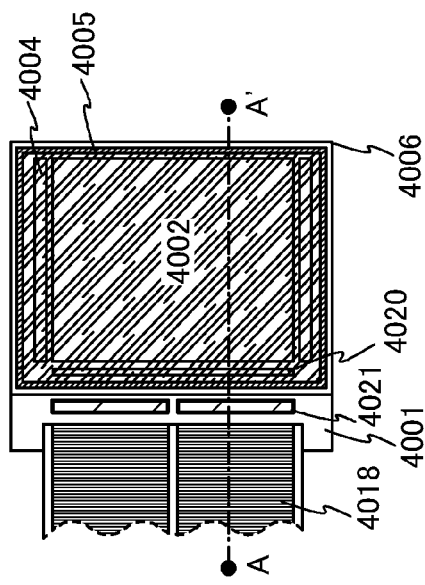
FIGS. 12A and 12B are a top view and a cross-sectional view of a light-emitting device.
Figure 12B:
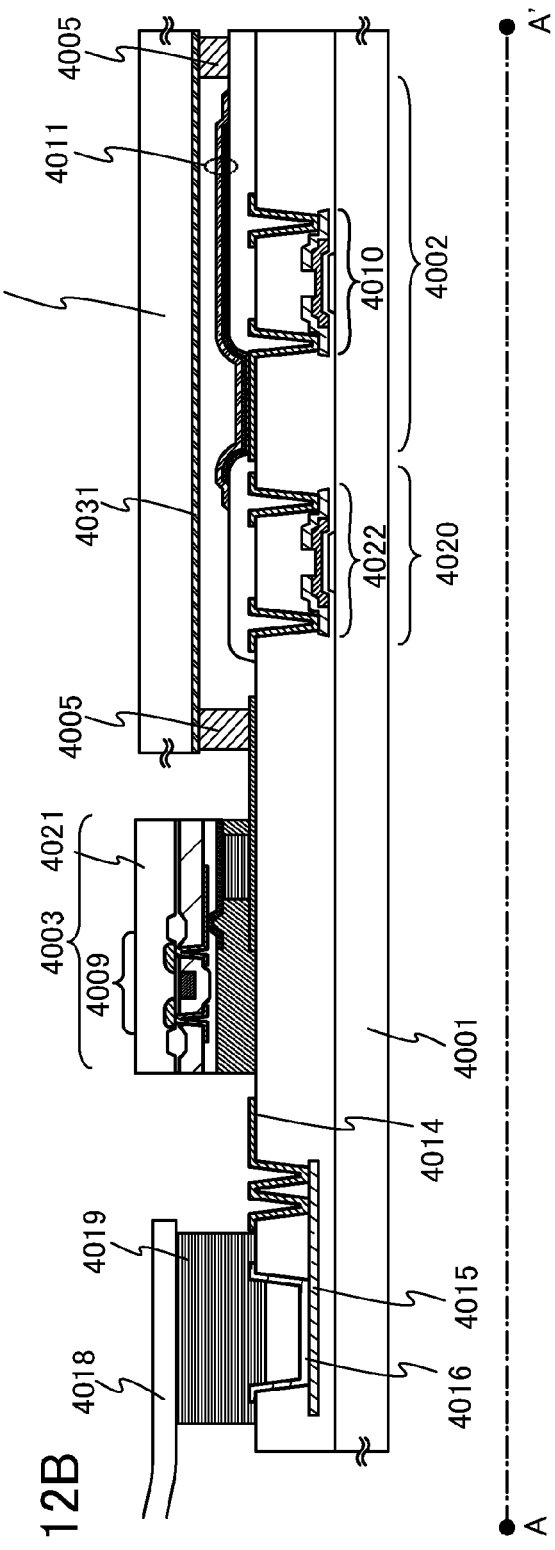

Next, an appearance of a light-emitting device according to one embodiment of the present invention is described with reference to FIGS. 12A and 12B. FIG. 12A is a top view of a light-emitting device where a substrate 4001 and a substrate 4006 are bonded to each other with a sealant 4005. FIG. 12B corresponds to a cross-sectional view taken along broken line A-A' in FIG. 12A.

The sealant 4005 is provided to surround a pixel portion 4002, a scan line driver circuit 4004, and a selection circuit 4020 provided over the substrate 4001. The substrate 4006 is provided over the pixel portion 4002, the scan line driver circuit 4004, and the selection circuit 4020. Thus, the pixel portion 4002, the scan line driver circuit 4004, and the selection circuit 4020 are sealed by the substrate 4001, the sealant 4005, and the substrate 4006.

A substrate 4021 provided with a signal line driver circuit 4003 is mounted in a region which is different from a region surrounded by the sealant 4005 over the substrate 4001. FIG. 12B illustrates a transistor 4009 included in the signal line driver circuit 4003.

A plurality of transistors are included in the pixel portion 4002, the scan line driver circuit 4004, and the selection circuit 4020 provided over the substrate 4001. FIG. 12B illustrates a transistor 4010 included in the pixel portion 4002 and a transistor 4022 included in the selection circuit 4020.

A light-emitting element 4011 is electrically connected to the transistor 4010.

A variety of signals (including image signals) and potentials are supplied to the signal line driver circuit 4003, the selection circuit 4020, the scan line driver circuit 4004, and the pixel portion 4002 from a connection terminal 4016 through lead wirings 4014 and 4015. The connection terminal 4016 is electrically connected to a terminal of an FPC 4018 through an anisotropic conductive film 4019.

This embodiment can be combined with any of the other embodiments as appropriate.

Embodiment 6

A light-emitting device according to one embodiment of the present invention can be used for display devices, personal computers, or image reproducing devices provided with recording media (typically, devices that reproduce the content of recording media such as digital versatile discs (DVDs) and have displays for displaying the reproduced images). Further, as electronic devices that can include the light-emitting device according to one embodiment of the present invention, cellular phones, game machines (including portable game machines), personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATMs), vending machines, and the like can be given. FIGS. 13A to 13E illustrate specific examples of these electronic devices.

Figure 13A:
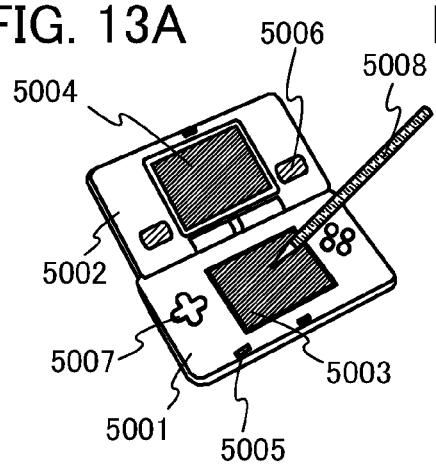
FIGS. 13A to 13E each illustrate an electronic device.

FIG. 13A illustrates a portable game machine, which includes a housing 5001, a housing 5002, a display portion 5003, a display portion 5004, a microphone 5005, speakers 5006, an operation key 5007, a stylus 5008, and the like. It is possible to use the light-emitting device according to one embodiment of the present invention as the display portion 5003 or 5004. Note that although the portable game machine in FIG. 13A has the two display portions 5003 and 5004, the number of display portions included in the portable game machine is not limited thereto.

Figure 13B:
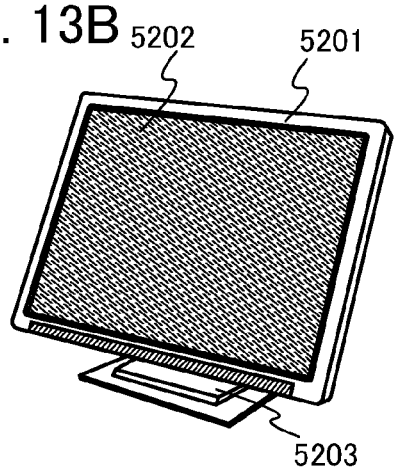

FIG. 13B illustrates a display device, which includes a housing 5201, a display portion 5202, a support 5203, and the like. It is possible to use the light-emitting device according to one embodiment of the present invention as the display portion 5202. Note that the display device means all display devices for displaying information, such as display devices for personal computers, for receiving TV broadcast, and for displaying advertisements.

Figure 13C:
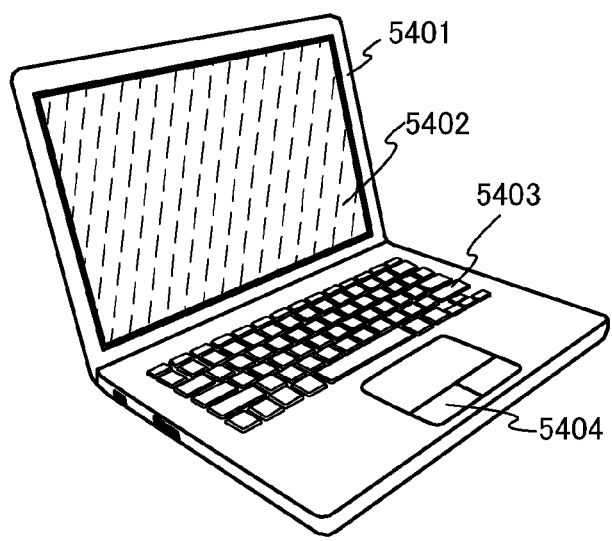

FIG. 13C illustrates a laptop, which includes a housing 5401, a display portion 5402, a keyboard 5403, a pointing device 5404, and the like. It is possible to use the light-emitting device according to one embodiment of the present invention as the display portion 5402.

Figure 13D:
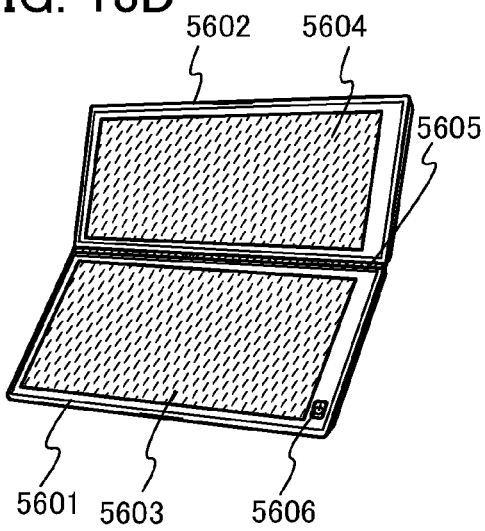

FIG. 13D illustrates a personal digital assistant, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. An image on the first display portion 5603 may be switched depending on the angle between the first housing 5601 and the second housing 5602 at the joint 5605. A light-emitting device with a position input function may be used as at least one of the first display portion 5603 and the second display portion 5604. Note that the position input function can be added by provision of a touch panel in a light-emitting device. Alternatively, the position input function can be added by provision of a photoelectric conversion element called a photosensor in a pixel portion of a light-emitting device. It is possible to use the light-emitting device according to one embodiment of the present invention as the first display portion 5603 or the second display portion 5604.

Figure 13E:
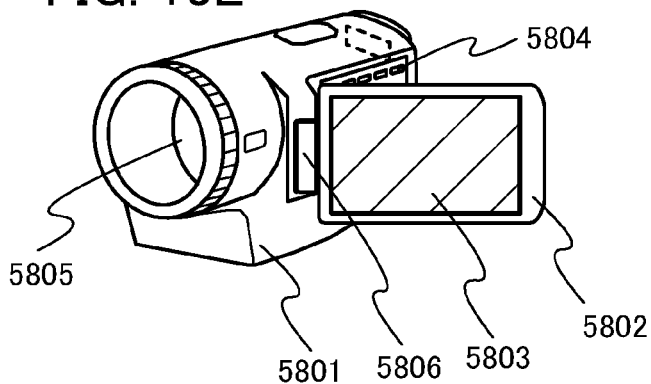

FIG. 13E illustrates a video camera, which includes a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and an angle between the first housing 5801 and the second housing 5802 can be changed with the joint 5806. An image on the display portion 5803 may be switched depending on the angle between the first housing 5801 and the second housing 5802 at the joint 5806. It is possible to use the light-emitting device according to one embodiment of the present invention as the display portion 5803.

This embodiment can be combined with any of the other embodiments as appropriate.

This application is based on Japanese Patent Application serial No. 2012-124026 filed with Japan Patent Office on May 31, 2012, the entire contents of which are hereby incorporated by reference.

What is claimed is:

1. A light-emitting device comprising:
   a selection circuit comprising:
      a first switch comprising a first terminal and a second terminal;
      a second switch comprising a first terminal and a second terminal, wherein the first terminal of the second switch is electrically connected to the second terminal of the first switch;
      a first capacitor comprising a first terminal and a second terminal, wherein the first terminal of the first capacitor is electrically connected to the second terminal of the first switch and the first terminal of the second switch;
      a third switch comprising a first terminal and a second terminal, wherein the first terminal of the third switch is electrically connected to the first terminal of the first switch;
      a fourth switch comprising a first terminal and a second terminal, wherein the first terminal of the fourth switch is electrically connected to the second terminal of the third switch;
      a second capacitor comprising a first terminal and a second terminal, wherein the first terminal of the second capacitor is electrically connected to the second terminal of the third switch and the first terminal of the fourth switch;
      a fifth switch comprising a first terminal and a second terminal, wherein the first terminal of the fifth switch is electrically connected to the second terminal of the second switch; and
      a sixth switch comprising a first terminal and a second terminal, wherein the first terminal of the sixth switch is electrically connected to the second terminal of the fifth switch and the second terminal of the second capacitor; and
   a first pixel electrically connected to the second terminal of the second switch and the first terminal of the fifth switch,
   wherein the first pixel comprises a light-emitting element.

2. The light-emitting device according to claim 1, wherein each of the second terminal of the first capacitor, the second terminal of the fourth switch, and the second terminal of the sixth switch is configured to be supplied with a reference potential.

3. The light-emitting device according to claim 1, further comprising a signal line driver circuit electrically connected to the first terminal of the first switch and the first terminal of the third switch.

4. The light-emitting device according to claim 1, further comprising a substrate, wherein the selection circuit and the first pixel are provided over the substrate.

5. The light-emitting device according to claim 4, further comprising a signal line driver circuit mounted on the substrate, wherein the signal line driver circuit is electrically connected to the first terminal of the first switch and the first terminal of the third switch.

6. The light-emitting device according to claim 4, further comprising:
   a flexible printed circuit (FPC) mounted on the substrate; and
   a signal line driver circuit mounted on the FPC,
   wherein the signal line driver circuit is electrically connected to the first terminal of the first switch and the first terminal of the third switch.

7. The light-emitting device according to claim 1, further comprising a second pixel electrically connected to the second terminal of the second switch and the first terminal of the fifth switch, wherein the second pixel comprises a light-emitting element.

8. A light-emitting device comprising:
   a selection circuit comprising:
      a first transistor comprising a first terminal, a second terminal, and a gate;
      a second transistor comprising a first terminal, a second terminal, and a gate, wherein the first terminal of the second transistor is electrically connected to the second terminal of the first transistor;
      a first capacitor comprising a first terminal and a second terminal, wherein the first terminal of the first capacitor is electrically connected to the second terminal of the first transistor and the first terminal of the second transistor;
      a third transistor comprising a first terminal, a second terminal, and a gate, wherein the first terminal of the third transistor is electrically connected to the first terminal of the first transistor;
      a fourth transistor comprising a first terminal, a second terminal, and a gate, wherein the first terminal of the fourth transistor is electrically connected to the second terminal of the third transistor;
      a second capacitor comprising a first terminal and a second terminal, wherein the first terminal of the second capacitor is electrically connected to the second terminal of the third transistor and the first terminal of the fourth transistor;
      a fifth transistor comprising a first terminal, a second terminal, and a gate, wherein the first terminal of the fifth transistor is electrically connected to the second terminal of the second transistor; and
      a sixth transistor comprising a first terminal, a second terminal, and a gate, wherein the first terminal of the sixth transistor is electrically connected to the second terminal of the fifth transistor and the second terminal of the second capacitor; and
   a first pixel electrically connected to the second terminal of the second transistor and the first terminal of the fifth transistor,
   wherein the first pixel comprises a light-emitting element.

9. The light-emitting device according to claim 8, wherein each of the second terminal of the first capacitor, the second terminal of the fourth transistor, and the second terminal of the sixth transistor is configured to be supplied with a reference potential.

10. The light-emitting device according to claim 8, further comprising a signal line driver circuit electrically connected to the first terminal of the first transistor and the first terminal of the third transistor.

11. The light-emitting device according to claim 8, further comprising a substrate, wherein the selection circuit and the first pixel are provided over the substrate.

12. The light-emitting device according to claim 11, further comprising a signal line driver circuit mounted on the substrate, wherein the signal line driver circuit is electrically connected to the first terminal of the first transistor and the first terminal of the third transistor.

13. The light-emitting device according to claim 11, further comprising:
   a flexible printed circuit (FPC) mounted on the substrate; and
   a signal line driver circuit mounted on the FPC,
   wherein the signal line driver circuit is electrically connected to the first terminal of the first transistor and the first terminal of the third transistor.

14. The light-emitting device according to claim 8, further comprising a second pixel electrically connected to the second terminal of the second transistor and the first terminal of the fifth transistor, wherein the second pixel comprises a light-emitting element.

15. A light-emitting device comprising:
   a substrate;
   a display portion over the substrate, wherein the display portion comprises a pixel comprising a light-emitting element;
   a selection circuit over the substrate; and
   a signal line driver circuit functionally connected to the selection circuit,
   wherein the signal line driver circuit is configured to output:
      a first image signal having one of a positive polarity and a negative polarity; and
      a second image signal having the other of the positive polarity and the negative polarity, and
   wherein the selection circuit is configured to:
      invert the one of the positive polarity and the negative polarity of the first image signal into the other of the positive polarity and the negative polarity; and
      supply the inverted signal of the first image signal and the second image signal to the display portion.

16. The light-emitting device according to claim 15, wherein the selection circuit comprises:
   a first switch comprising a first terminal and a second terminal, wherein the first terminal of the first switch is electrically connected to the signal line driver circuit;
   a second switch comprising a first terminal and a second terminal, wherein the first terminal of the second switch is electrically connected to the second terminal of the first switch;
   a first capacitor comprising a first terminal and a second terminal, wherein the first terminal of the first capacitor is electrically connected to the second terminal of the first switch and the first terminal of the second switch;
   a third switch comprising a first terminal and a second terminal, wherein the first terminal of the third switch is electrically connected to the first terminal of the first switch and the signal line driver circuit;
   a fourth switch comprising a first terminal and a second terminal, wherein the first terminal of the fourth switch is electrically connected to the second terminal of the third switch;
   a second capacitor comprising a first terminal and a second terminal, wherein the first terminal of the second capacitor is electrically connected to the second terminal of the third switch and the first terminal of the fourth switch;

a fifth switch comprising a first terminal and a second terminal, wherein the first terminal of the fifth switch is electrically connected to the second terminal of the second switch; and a sixth switch comprising a first terminal and a second terminal, wherein the first terminal of the sixth switch is electrically connected to the second terminal of the fifth switch and the second terminal of the second capacitor, wherein the pixel is electrically connected to the second terminal of the second switch and the first terminal of the fifth switch.

17. The light-emitting device according to claim 16, wherein each of the second terminal of the first capacitor, the second terminal of the fourth switch, and the second terminal of the sixth switch is configured to be supplied with a reference potential.

18. The light-emitting device according to claim 15, wherein the selection circuit comprises:

a first transistor comprising a first terminal and a second terminal, wherein the first terminal of the first transistor is electrically connected to the signal line driver circuit;

a second transistor comprising a first terminal and a second terminal, wherein the first terminal of the second transistor is electrically connected to the second terminal of the first transistor;

a first capacitor comprising a first terminal and a second terminal, wherein the first terminal of the first capacitor is electrically connected to the second terminal of the first transistor and the first terminal of the second transistor;

a third transistor comprising a first terminal and a second terminal, wherein the first terminal of the third transistor is electrically connected to the first terminal of the first transistor and the signal line driver circuit;

a fourth transistor comprising a first terminal and a second terminal, wherein the first terminal of the fourth transistor is electrically connected to the second terminal of the third transistor;

a second capacitor comprising a first terminal and a second terminal, wherein the first terminal of the second capacitor is electrically connected to the second terminal of the third transistor and the first terminal of the fourth transistor;

a fifth transistor comprising a first terminal and a second terminal, wherein the first terminal of the fifth transistor is electrically connected to the second terminal of the second transistor; and a sixth transistor comprising a first terminal and a second terminal, wherein the first terminal of the sixth transistor is electrically connected to the second terminal of the fifth transistor and the second terminal of the second capacitor, wherein the pixel is electrically connected to the second terminal of the second transistor and the first terminal of the fifth transistor.

19. The light-emitting device according to claim 18, wherein each of the second terminal of the first capacitor, the second terminal of the fourth transistor, and the second terminal of the sixth transistor is configured to be supplied with a reference potential.

20. The light-emitting device according to claim 15, wherein the signal line driver circuit is mounted on the substrate.

21. The light-emitting device according to claim 15, wherein the inverted signal of the first image signal and the second image signal to be supplied to the display portion have the same polarity as each other.

* * * * *